(12) United States Patent
Sano et al.

(10) Patent No.: US 6,767,773 B2
(45) Date of Patent: Jul. 27, 2004

(54) METHOD OF PRODUCTION OF A THIN FILM TYPE SEMICONDUCTOR DEVICE HAVING A HEAT-RETAINING LAYER

(75) Inventors: Yasuyuki Sano, Kawasaki (JP); Akito Hara, Kawasaki (JP); Michiko Takei, Kawasaki (JP); Nobuo Sasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/230,161

(22) Filed: Aug. 29, 2002

(65) Prior Publication Data

US 2003/0042486 A1 Mar. 6, 2003

(30) Foreign Application Priority Data

Aug. 30, 2001 (JP) ........................................ 2001-262160
Jun. 20, 2002 (JP) ........................................ 2002-180425

(51) Int. Cl.⁷ ........................ H01L 21/00; H01L 21/331; H01L 21/76; H01L 21/20; H01L 21/302
(52) U.S. Cl. ........................ 438/151; 438/149; 438/150; 438/151; 438/164; 438/378; 438/412; 438/482; 438/486; 438/487; 438/488; 438/489; 438/704; 438/705; 438/706; 438/715; 438/725; 438/761; 438/764; 438/778; 438/949
(58) Field of Search ............................... 438/149–151, 438/164, 378, 412, 482, 486–489, 704–706, 715, 725, 761, 764, 778, 949

(56) References Cited

U.S. PATENT DOCUMENTS

| | | | | | |
|---|---|---|---|---|---|
| 5,915,174 | A | * | 6/1999 | Yamazaki et al. | 438/166 |
| 6,066,547 | A | * | 5/2000 | Maekawa | 438/486 |
| 6,255,148 | B1 | | 7/2001 | Hara et al. | |
| 6,322,625 | B2 | * | 11/2001 | Im | 117/43 |
| 6,387,779 | B1 | * | 5/2002 | Yi et al. | 438/486 |
| 6,475,835 | B1 | * | 11/2002 | Hu et al. | 438/147 |
| 6,573,163 | B2 | * | 6/2003 | Voutsas et al. | 438/487 |
| 2002/0053672 | A1 | * | 5/2002 | Yamazaki et al. | 257/66 |
| 2003/0104682 | A1 | * | 6/2003 | Hara et al. | 438/487 |

OTHER PUBLICATIONS

Patent Abstracts of Japan of JP 08228006 dated Sep. 3, 1996.

* cited by examiner

*Primary Examiner*—John F. Niebling
*Assistant Examiner*—Stanetta Isaac
(74) *Attorney, Agent, or Firm*—Staas & Halsey LLP

(57) ABSTRACT

An operating semiconductor layer is formed in such a manner that amorphous silicon layer is formed to be shaped so that it has a wide region and a narrow region and the narrow region is connected to the wide region at a position asymmetric to the wide region, and the amorphous silicon layer is crystallized by scanning a CW laser beam from the wide region toward the narrow region in a state that a polycrystalline silicon layer as a heat-retaining layer encloses the narrow region from a side face through the silicon oxide layer.

28 Claims, 26 Drawing Sheets

MECHANISM OF CRYSTAL GROWTH

⬇ CW LASER BEAM

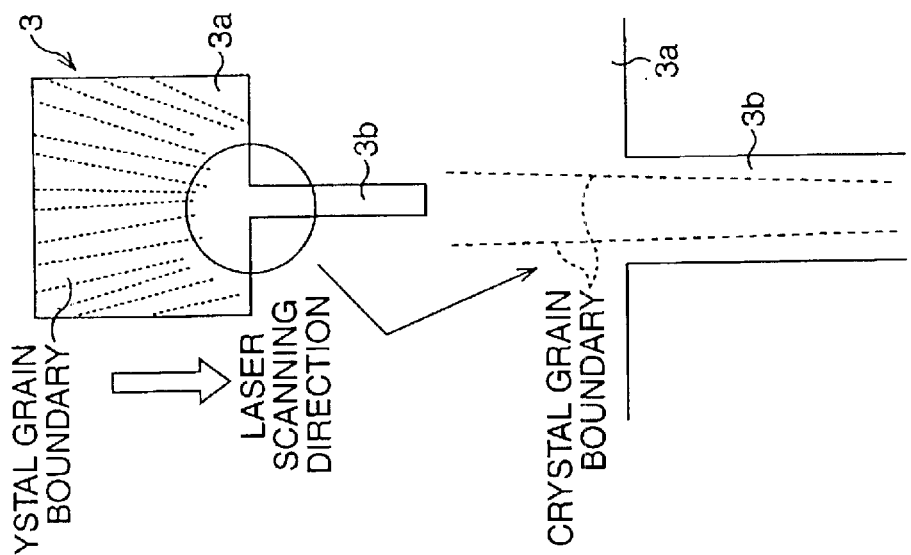
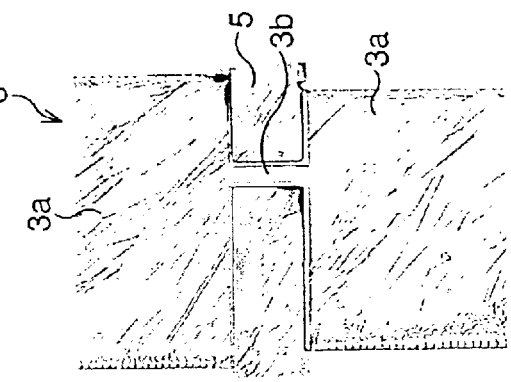
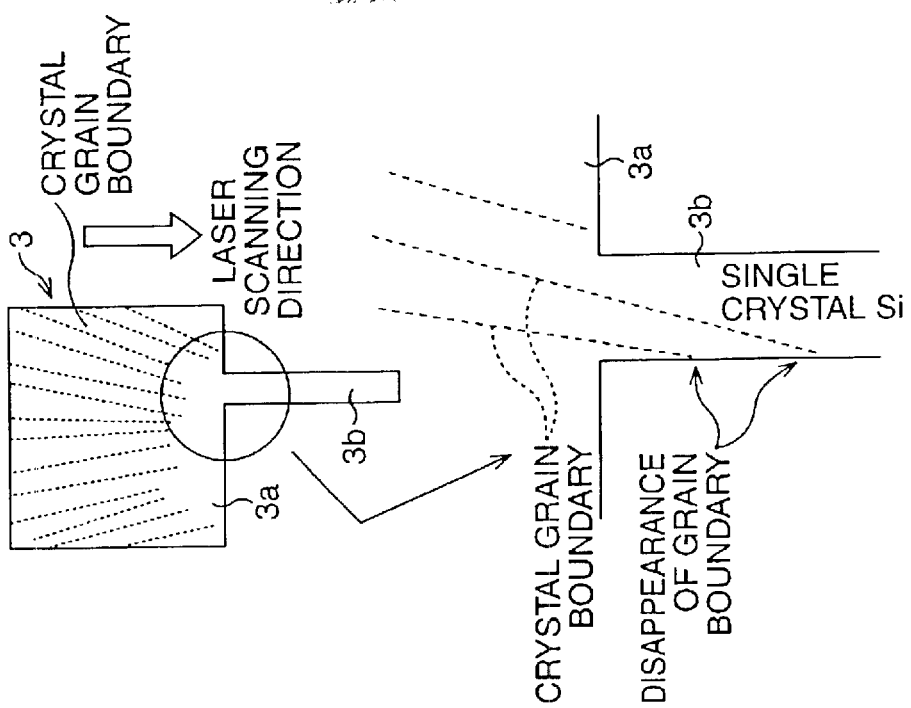

SCANNING IN −45° DIRECTION

SCANNING IN 30° DIRECTION

SCANNING IN 45° DIRECTION

SCANNING IN 60° DIRECTION

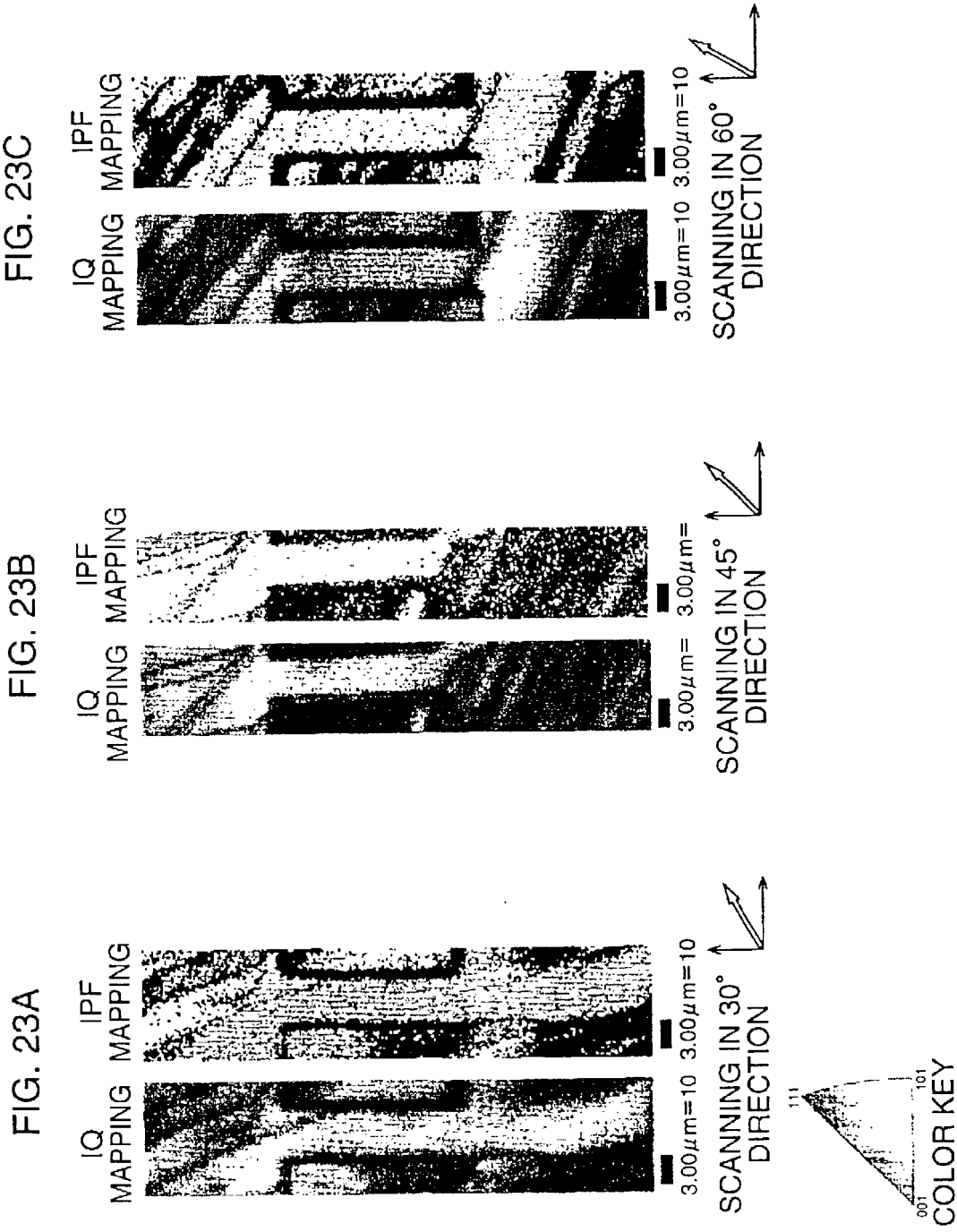

METHOD OF PRODUCTION OF A THIN FILM TYPE SEMICONDUCTOR DEVICE HAVING A HEAT-RETAINING LAYER

CROSS-REFERENCE TO RELATED APPLICATIONS

This application is based upon and claims priority of Japanese Patent Application Nos. 2001-262160, filed on Aug. 30, 2001, and 2002-180425, filed on Jun. 20, 2002, the contents being incorporated herein by reference.

BACKGROUND OF THE INVENTION

1. Field of the Invention

The present invention relates to a thin-film type semiconductor device having an operating semiconductor layer and a method of production thereof. In particular, it is favorable to apply to a thin-film transistor in which a source/drain is formed on the operating semiconductor layer and a gate electrode is formed on a channel area.

2. Description of the Related Art

Since a thin-film transistor (TFT) is formed into a very thin fine operating semiconductor layer, mounting on a large screen liquid crystal display panel and the like is expected considering recent demand for a big area.

For a TFT operating semiconductor layer, use of a polycrystalline silicon layer has been studied because it has high carrier mobility and is thermally stable compared to an amorphous silicon layer (a-Si layer). At present, the methods shown below are used for forming method of the operating semiconductor layer using the polycrystalline silicon layer.

(1) A method of forming the polycrystalline silicon layer by heating the a-Si layer between about 600° C. and about 1100° C. to crystallize has been adopted. This method plans to form a crystal nucleus at an early stage of the heating process and to crystallize by growing this crystal nucleus.

(2) The a-Si layer is melted by adding laser energy to form the polycrystalline silicon layer by crystallizing it when it is cooled.

(3) The polycrystalline silicon layer is formed directly by a chemical vapor growth method or a physical evaporation method at a temperature of 600° C. or more.

Here, using a method of forming a thin-film semiconductor layer on a glass substrate as an example, disadvantages of the conventional art are discussed. Since glass is used for a substrate material, the temperature of the substrate is limited to 600° C. or less.

The crystal growth method described in (1) requires a heat processing temperature of 600° C., which corresponds to heat processing at a high temperature for the glass and causes deformation of the glass. In addition, stacking faults and twin crystals are contained in the grown crystal in large quantity, which makes it impossible to expect formation of a polycrystalline silicon layer with excellent crystallinity.

With the crystal growth method described in (3), a columnar crystal is formed, which is insufficient in crystallinity because of its small crystal grain diameter, and a crystal showing a high mobility can not be formed.

With the method using laser anneal described in (2), a laser which can be used without raising the temperature of the substrate is limited to an excimer laser. When the excimer laser is used, a polycrystalline silicon layer of high quality can be obtained, because the crystal grows through a molten phase. However, it has a disadvantage in that the energy range for obtaining a polycrystalline silicon layer of such a high quality is extremely narrow. Furthermore, when the excimer laser is used, though only the thin-film silicon region on the surface layer is melted getting a high temperature, the temperature of the glass itself is low. Accordingly, the cooling rate of the silicon molten is high.

Therefore, growth from the molten occurs under a super cooling condition and many crystal nuclei are formed which makes the crystal grain diameter small. Generally, the range of the crystal grain diameter is about 300 nm to about 600 nm. When a thin-film polycrystalline silicon layer is formed using the excimer laser, which assures the best crystallinity, the mobility of the thin-film transistor is about 200 $cm^2/Vs$, which is far smaller compared to the mobility of a single crystal silicon of 600 $cm^2/Vs$. This is because the crystal grain diameter is small and the crystal grain boundary portion works as a scatterer with a strong carrier.

As above, there have conventionally been a serious disadvantage in that even the operating semiconductor layer is composed of the polycrystalline silicon layer, the lowering of the mobility due to the crystal grain boundary can not be restrained and the production of a high quality operating semiconductor layer can not be guaranteed.

SUMMARY OF THE INVENTION

An object of the present invention is to provide a thin-film type semiconductor device which realizes extremely high mobility by forming an operating semiconductor layer from a thin-film semiconductor layer having a negligibly small effect of a crystal grain boundary, and to provide a method for production of the semiconductor device which enables the semiconductor device to be produced easily and securely.

The present invention provides the following embodiments to solve the above-described disadvantages.

The present invention relates to a thin-film type semiconductor device provided with an operating semiconductor layer on a substrate and a method for production thereof.

In the semiconductor device of the present invention, the operating semiconductor layer is shaped so that a wide region and a narrow region are connected with each other. The wide region is in a flow pattern state with a large crystal grain, and a direction of a crystal grain boundary in the above-described flow pattern is formed not to be parallel to a longitudinal direction of the narrow region, while the narrow region is substantially in a single crystalline state.

The method for producing the semiconductor device of the present invention comprises the steps of: forming a semiconductor layer which is to be the operating semiconductor layer above the substrate; processing the semiconductor layer to be shaped so that it has a wide region and a narrow region and the narrow region is connected to the wide region in a manner that the narrow region is positioned to be asymmetric with respect to the wide region, and crystallizing the semiconductor layer by irradiating energy beam to the semiconductor layer along the longitudinal direction of the narrow region from the wide region toward the narrow region.

Another aspect of the method for producing the semiconductor device of the present invention comprises the steps of: forming a semiconductor layer to be the operating semiconductor layer above the substrate; processing the semiconductor layer to be shaped so that it has a wide region and a narrow region; and crystallizing the semiconductor layer by irradiating energy beam to the semiconductor layer in such a manner that a scanning plane of a beam spot is inclined from a perpendicular position to a longitudinal direction of the semiconductor layer.

From the above consideration, if an outbreak of the crystal grain boundary bringing about lowering of the mobility can be restrained, the mobility is improved and performance of the semiconductor element can be improved. For this purpose, it is satisfactory to structure the operating semiconductor layer from a crystal grain having a large crystal grain diameter and the ultimate figure of the operating semiconductor layer is a complete single crystal semiconductor.

In the semiconductor device according to the present invention, the operating semiconductor layer is structured such that the wide region is in a crystalline state with a flow pattern having a large crystal grain and the narrow region is substantially in a single crystalline state. Since there exists actually no crystal grain boundary due to the flow pattern in the narrow region, therefore, when the narrow region is used as a channel, a semiconductor device having a high mobility can be obtained without fail.

In a method of production of the semiconductor device according to the present invention, energy beam is irradiated to the semiconductor layer, which is patterned to be shaped so that the narrow region is connected to the wide region in a manner that the narrow region is positioned to be asymmetric with respect to the wide region, along the longitudinal direction of the narrow region from the wide region toward the narrow region. At this time, the wide region is solidified along the direction of the irradiation, and a flow pattern including crystal grains having a large diameter controlled in growth direction is formed in the wide region. The crystal grain boundary is formed toward the narrow region in the flow pattern. Though the shape of the crystal grain boundary formed with whole of respective flow patterns is symmetric with respect to the direction of the irradiation, since the narrow region is formed to be asymmetric with respect to the wide region, the crystal grain boundary collides against a wall in the narrow region near the boundary between the narrow region and the wide region and disappears with high possibility, which restrains formation of the crystal grain boundary in the narrow region. Owing to this effect, an operating semiconductor layer in which the wide region is in a crystalline state having a flow pattern with a large crystal grain and the narrow region is substantially in a single crystalline state is to be formed.

In another aspect of the method for producing the semiconductor device of the present invention, energy beam is irradiated to the semiconductor layer, which is patterned to be shaped so that the narrow region and the wide region are connected to each other in a manner that the narrow region is positioned to be asymmetric with respect to the wide region, in such a manner that a scanning plane of a beam spot is inclined from a perpendicular position to a longitudinal direction of the semiconductor layer. At this time, the wide region is solidified along the direction of the irradiation, and a flow pattern including crystal grains having a large diameter controlled in growth direction is formed in the wide region. The crystal grain boundary is formed toward the narrow region in the flow pattern. Though the shape of the crystal grain boundary formed with whole of respective flow patterns is symmetric with respect to the direction of the irradiation, since an inclination angle is given to the scanning plane of the beam, the crystal grain boundary securely collides against a wall in the narrow region near the boundary between the narrow region and the wide region and disappears, which restrains formation of the crystal grain boundary in the narrow region. Owing to this effect, an operating semiconductor layer in which the wide region is in a crystalline state having a flow pattern with a large crystal grain and the narrow region is substantially in a single crystalline state is to be formed.

The methods of production of the semiconductor device according to the present invention further comprise the steps of: forming a heat-retaining layer so as to cover only a side portion of the narrow region selectively; and irradiating energy beam in this state. Then, the heat-retaining layer serves as a heat reservoir having a large heat capacity to make cooling rate of a molten small and to control the heat distribution of the semiconductor layer so that the position of nucleus formation and direction of crystal growth are controlled. In this case, crystallization proceeds by progress of the temperature lowering from a center portion of the narrow region. However, since the side portion of the narrow region is selectively covered with the heat-retaining layer, it is the most difficult to lower the temperature of this side portion and effective crystallization can be realized. Therefore, the crystalline state having a large crystal grain diameter can be realized with high reliability.

BRIEF DESCRIPTION OF THE DRAWINGS

FIG. 7A, FIG. 7B, and FIG. 7C are diagrammatic plan views showing a state of the crystal growth together with a comparison example;

FIG. 23A, FIG. 23B, and FIG. 23C are views showing result in a mapping analysis observing by an EBSD system the same narrow region as that of the photographs by the optical microscope in FIG. 22A, FIG. 22B, FIG. 22C, and FIG. 22D;

DETAILED DESCRIPTION OF THE PREFERRED EMBODIMENTS

Figure 1A:
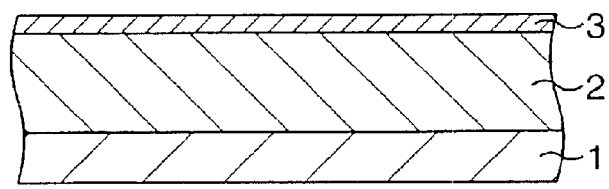
FIG. 1A, FIG. 1B, FIG. 1C and FIG. 1D are diagrammatic sectional views showing a method of forming an operating semiconductor layer in process order in a first forming method of an embodiment.

Hereinafter, concrete embodiments to which the present invention is applied will be explained in detail with reference to the drawings.

In the present embodiment, a thin-film transistor (TFT) is exemplified as a semiconductor device, and the configuration thereof will be explained as well as a method of production thereof.

Structure of an Operating Semiconductor Layer

On describing the method of production, structure of a TFT operating semiconductor layer which is a characteristic of the present invention will be explained first.

The most important point required to the operating semiconductor layer characterizing the present invention is to make a channel portion of the operating semiconductor layer a single crystal structure substantially. It is important to realize the following mechanisms for forming the operating semiconductor layer having such a configuration on a substrate with no existing seed crystal.

(1) mechanism to form one crystal grain,
(2) mechanism to control the growth direction, and
(3) mechanism to restrain the occurrence of other crystal grains during the growth.

Concerning (1)

In order to form one crystal grain, it is necessary to remove excess crystal grain boundary from a region where a single crystal is expected to form.

Concerning (2)

Excimer Laser Crystallization (ELC) depends on a process of melting and solidification in high speed. The crystal grows from a crystal nucleus formed by chance on an interface between a silicon molten and a foundation. It is extremely difficult to control the position of the crystal nucleus. When the number of the crystal nuclei is small, the crystal grain diameter is far lager than the thickness of a silicon layer, so that it can be considered that a lateral growth occurs though the distance of the crystal grain is short. The size of the crystal is decided by the collision of the crystal grain which has grown from the adjacent crystal nucleus. The lateral growth is not controlled artificially, but is a natural phenomenon. On the other and, in the crystallization process using energy beam, a CW laser here, to output energy continuously with respect to time, a flow pattern is formed by scanning the energy beam so that the growth direction can be controlled over a certain distance.

Concerning (3)

In order to restrain the growth of the crystal grains other than the targeted one, it is required to control the temperature gradient of the semiconductor layer.

In order to form a channel region with single crystals, it is necessary to prevent the crystal grain boundary which is to be the boundary of the flow pattern from entering into the channel region. Therefore, the present invention proposes a mechanism to prevent the crystal grain boundary from entering into the channel region based on the mechanisms (1) through (3), as will be described later.

Forming Method of an Operating Semiconductor Layer

A forming method of an operating semiconductor layer is described next.

(First Forming Method)

Primarily, a first forming method is explained. FIG. 1A, FIG. 1B, FIG. 1C, FIG. 1D and FIG. 2A, FIG. 2B, FIG. 2C, FIG. 2D are diagrammatic sectional views showing the first forming method of the operating semiconductor layer in its process order.

First, as shown in FIG. 1A, a silicon oxide layer 2 which is to be a buffer layer is formed on a glass substrate 1 in a layer thickness of about 400 nm. Then as a semiconductor layer with a layer thickness of about 200 nm, here an amorphous silicon layer 3 made of amorphous silicon is formed by a PECVD method. The layer thickness of the amorphous silicon layer 3 is made to be 400 nm or less, preferably about 30 nm through about 200 nm, with respect to the relation with the layer thickness of the heat-retaining layer described later. Next, heat processing at 450° C. is applied on the glass substrate 1 for 2 hours to remove hydrogen.

Figure 1B:
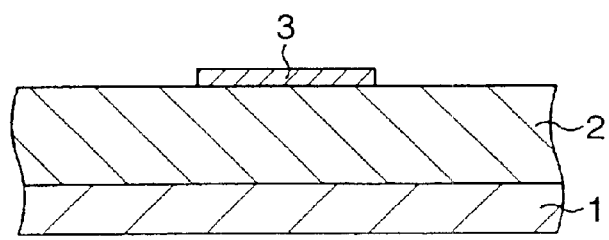
Figure 3:
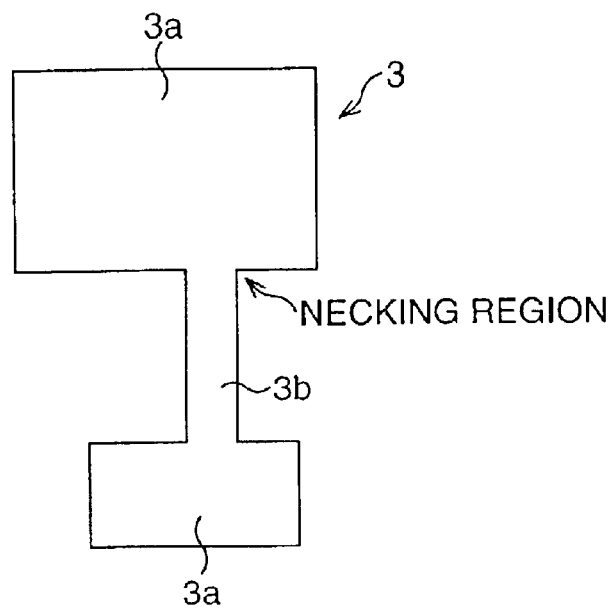
FIG. 3 is a diagrammatic plan view showing a processed amorphous silicon layer.

Next, as shown in FIG. 1B, the amorphous silicon layer 3 is processed into an island shape. In the present embodiment, the amorphous silicon layer 3 is patterned by photolithography and dry etching to be shaped so that it has a wide region 3a and a narrow region 3b and the narrow region 3b is connected to the wide region 3a in a manner that the narrow region 3b is positioned to be asymmetric with respect to the wide region 3a as shown in FIG. 3. Here, the vicinity of the boundary between the wide region 3a and the narrow region 3b becomes a necking region.

Figure 1C:
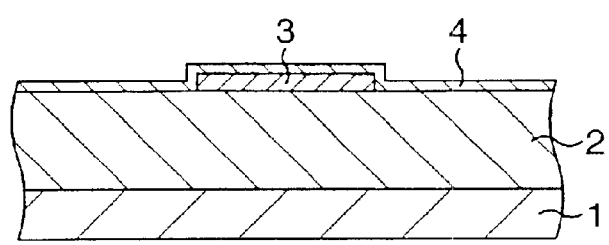

Then, as shown in FIG. 1C, a silicon oxide layer 4 which serves as a separation layer is formed by the PECVD method to have the layer thickness of about 50 nm and to cover the whole surface (side face and upper face) of the amorphous silicon layer 3.

Figure 1D:
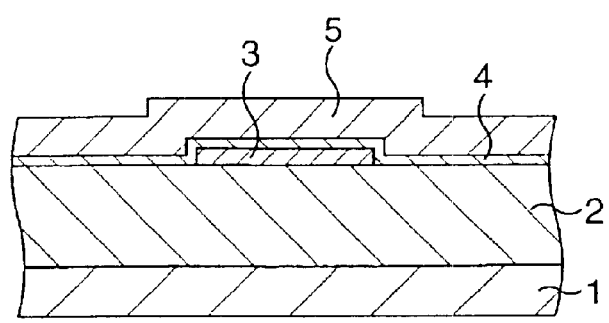

Next, as shown in FIG. 1D, an amorphous silicon layer is formed to have the layer thickness of about 250 nm by a plasma CVD method to cover the amorphous silicon layer 3 through the silicon oxide layer 4, and the amorphous silicon layer is changed into a polycrystalline silicon layer 5 by a metal induce solid-phase growth using nickel (Ni). For a metal impurity to induce the solid-phase growth, any metal other than Ni can be used. At this time, the solid-phase growth temperature is set to be 570° C. and time for the heat processing is set to be 8 hours. Though the amorphous silicon layer having the layer thickness of about 250 nm is changed into the polycrystalline silicon layer 5 through this processing, the amorphous silicon layer 3 covered with the silicon oxide film 4 which serves as the separation layer is kept in a state of amorphous silicon because the silicon oxide layer 4 prevents Ni from dispersion.

The polycrystalline silicon layer 5 may be formed so as to cover the amorphous silicon layer 3 by a chemical vapor growth method or a physical evaporation method from the beginning. It is also preferable to use amorphous silicon.

Figure 2A:
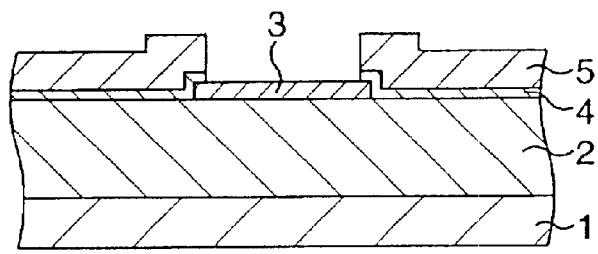
FIG. 2A, FIG. 2B, FIG. 2C and FIG. 2D are diagrammatic sectional views showing the method of forming the operating semiconductor layer in process order following to FIG. 1A, FIG. 1B, FIG. 1C and FIG. 1D.
Figure 4:
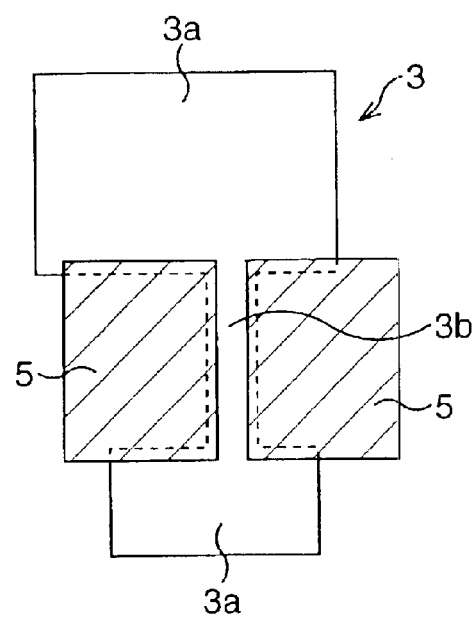
FIG. 4 is a diagrammatic plan view showing a state of the amorphous silicon layer on which a heat-retaining layer is formed.

Then, as shown in FIG. 2A and FIG. 4, the polycrystalline silicon layer 5 is patterned in an island shape to cover the side portion of the narrow region 3b, and then the exposed silicon oxide layer 4 is removed using HF solution. At this time, the surface of the narrow region 3b is exposed except the side portion.

Figure 2B:
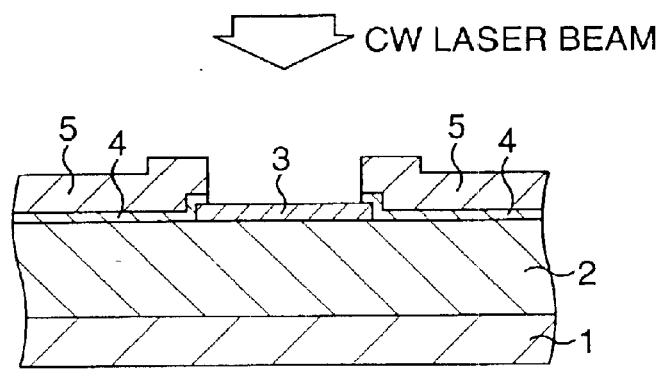

Then, as shown in FIG. 2B, the narrow region 3b is irradiated with a CW laser beam, here a solid-state laser (DPSS laser) of semiconductor excitation (LD excitation), from the top surface in a state that the polycrystalline silicon layer 5 as a heat-retaining layer encloses the narrow region 3b through the silicon oxide layer 4 from the side face to crystallize the amorphous silicone layer 3 so that the operating semiconductor layer 11 is formed.

Here, as one example, the above-described solid-state laser is semiconductor LD excitation Nd: $YVO_4$ laser using second harmonic with wavelength of 532 nm, whose output is 10 W. In the solid-state laser of the semiconductor LD excitation, a noise (light noise) indicating instability of the energy beam is 0.1 rms % or less in a region of 10 Hz to 2 MHz, and an index of the energy beam output instability is less than ±1% per hour, which is extremely excellent compared to other energy beams.

Incidentally, a portion which the CW laser beam irradiates is not limited to the front surface side of the substrate, but it may irradiate from the back face side.

Figure 5:
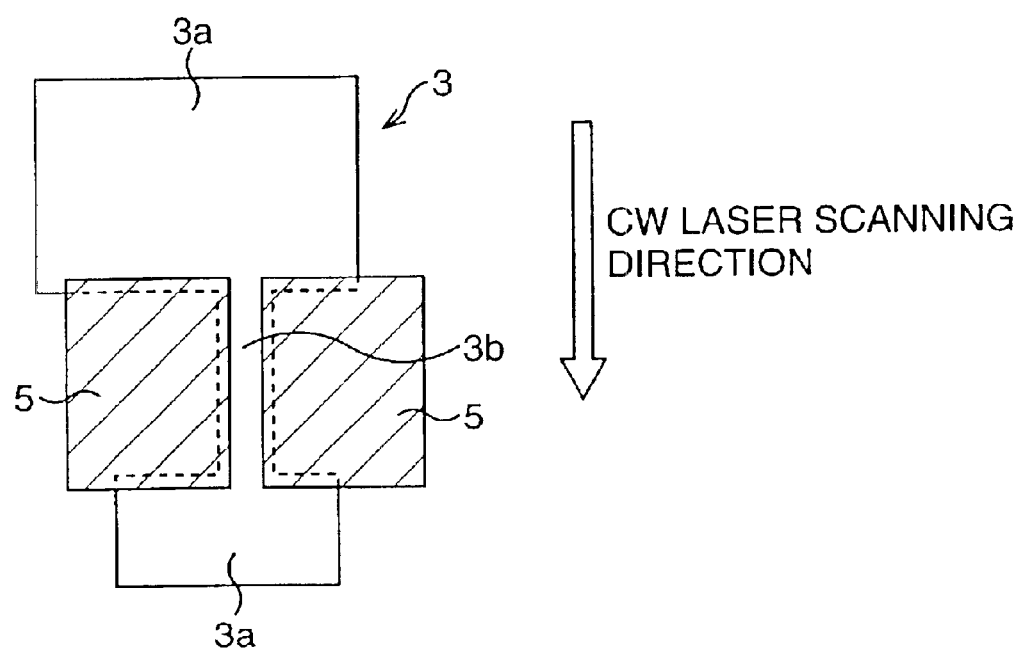
FIG. 5 is a diagrammatic plan view showing a direction of irradiation of a CW laser beam.

As for the direction in irradiation (the scanning direction) of the CW laser beam, as shown in FIG. 5, the beam is scanned in parallel to the longitudinal direction of the narrow region 3b, from the wide region 3a which is large in area toward the narrow region 3b which is small in area. At this time, the necking region where the width becomes narrower abruptly produces so-called filtering effect, whereby many crystal grain boundaries disappear in this region and the crystal grain boundary is restrained from entering into the narrow region 3b. Therefore, a single crystal silicon is formed. Incidentally, when irradiating the CW laser beam, it is also suitable to irradiate the CW laser beam outputting energy continuously with its pulse modulated by matching to the narrow region 3b.

A mechanism to form a single crystal silicon by irradiation of the CW laser beam according to the forming method is described as follows.

Figure 6A:
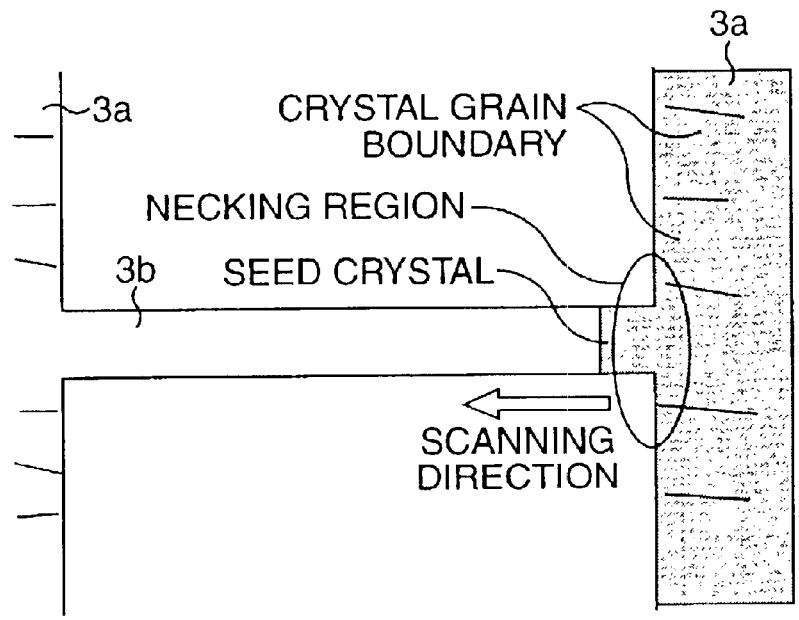
FIG. 6A and FIG. 6B are diagrammatic plan views showing a state of the crystal growth.
Figure 6B:
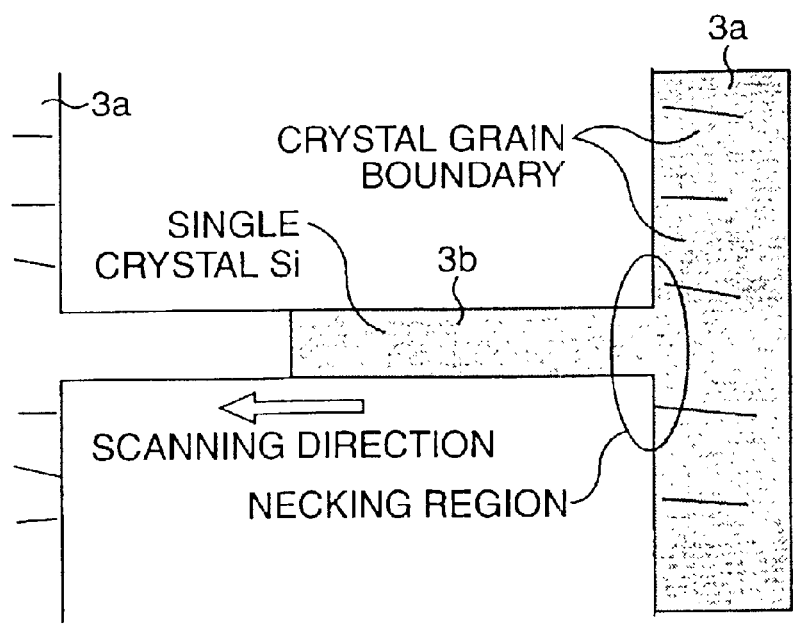

Since the amorphous silicon layer 3 is covered with a thick polycrystalline silicon layer 5 which serves as a heat-retaining layer only at side portions of the narrow region 3b, the polycrystalline silicon layer 5 at the side surface serves as a heat reservoir. As a result, no crystal nucleus generates from the side edge of the narrow region 3b. In this case, crystallization proceeds by the progress of the temperature lowering from the center portion of the narrow region 3b. However, since only the side portion of the narrow region 3b is selectively covered with the polycrystalline silicon layer 5, it is the most difficult to lower the temperature of this side portion and therefore effective crystallization can be realized. The single crystal grain selected in the necking region serves as a seed crystal at the time of crystallization of the narrow region 3b (FIG. 6A). Since the CW laser beam is scanned in parallel to the narrow region 3b, a solid-liquid interface also moves in parallel to the narrow region 3b. Since crystallization progresses from only one seed crystal, a single crystal silicon is to be formed in the narrow region 3b (FIG. 6B).

In the crystal growth in the wide region 3a, a crystal nucleus is formed at the edge of the wide region 3a, and the growth of the crystal progresses toward the inside.

In the wide region 3a, as shown in FIG. 7A, the crystal growth is performed in a flow pattern flowing in the scanning direction of a large grain having 5 μm or more of a crystal grain diameter, namely corresponding to 10 to 100 times as large as the grain diameter of the crystal formed by excimer laser crystallization (ELC). At this time, the crystal grain boundary progresses toward the center of the wide region 3a.

Actual result of observation with an optical microscope is shown in FIG. 7B. This image shows a view in which a crystal grain boundary is actualized through performing seccoetching.

An example of forming the narrow region 3b to be symmetric with respect to the wide region 3a is shown in FIG. 7C to compare with the present example. Thus, since the crystal grain boundary of the flow pattern formed in the wide region 3a has a tendency to progress toward the center of the wide region 3a, when the narrow region 3b is set to place in the central portion of the wide region 3a, the crystal grain boundary enters into the narrow region 3b in large quantity. At this time, possibility of single crystal growth in the narrow region 3b comes to extremely low.

On the other hand, since the narrow region 3b is formed to be asymmetric with respect to the wide region 3a in this example, the crystal grain boundary is to run obliquely towards the narrow region 3b. Accordingly, at the boundary portion in the narrow region 3b to the wide region 3a, the crystal grain boundary collides against the wall of the narrow region 3b and disappears, so that entering to the inside of the narrow region 3b is restrained. Therefore, the narrow region 3b is quite easy to get a single crystal state.

Additionally, it is owing to the fact that the crystal grain has a tendency to grow larger as the scanning distance is longer, because the CW laser beam is scanned from the wide region 3a having a large area toward the narrow region 3b having a small area. Once a large crystal grain is formed, the possibility of the crystal grain boundary entering into the narrow region 3b is decreased. Accordingly, it is desirable that the width of the narrow region 3b is narrower than the width of the crystal grain.

Furthermore, in the narrow region 3b, at the time of solidification after melting by the CW laser beam, temperature distribution of low temperature at the central portion and high temperature at the peripheral portion is formed. Owing to this temperature distribution, since the temperature gradient from the central portion toward the peripheral portion is formed, even if a crystal grain boundary is mixed into the narrow region 3b, it runs away toward the outside during growth of crystal. In other words, when the scanning distance becomes longer, all defect portions run outside so that formation of the single crystal is promoted.

Due to the mechanism described above, the narrow region 3b is crystallized in a single crystal formation.

Figure 2C:
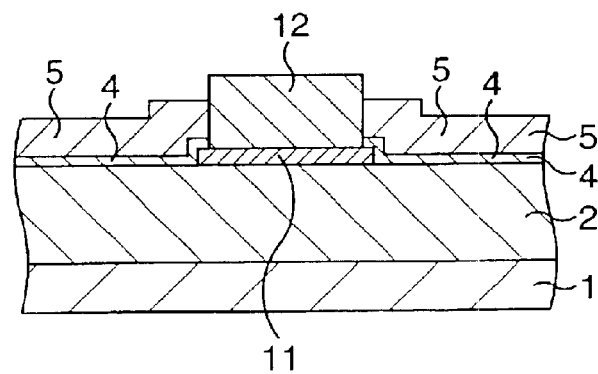
Figure 8:
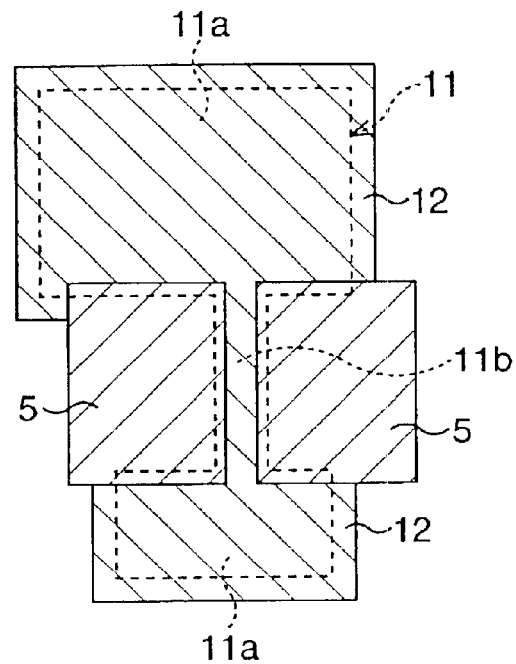
FIG. 8 is a diagrammatic plan view showing the operating semiconductor layer partially covered with a resist.

Then, as shown in FIG. 2C and FIG. 8, a portion where neither the silicon oxide layer 4 nor the polycrystalline silicon layer 5 exists in thus formed operating semiconductor layer 11 is covered with a resist film 12.

Figure 2D:
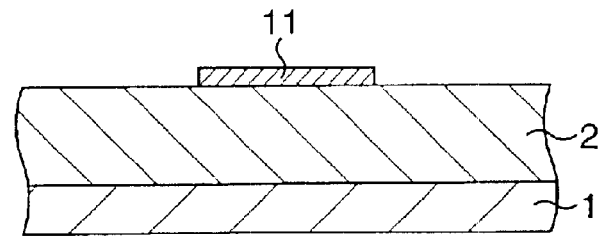

As shown in FIG. 2D, after the polycrystalline silicon layer 5 is removed by dry etching using the resist film 12 as a mask, the resist film 12 is removed by ashing treatment or the like, then the silicon oxide layer 4 is removed by HF solution.

As above, the operating semiconductor layer (silicon island) 11 is completed.

Figure 10:
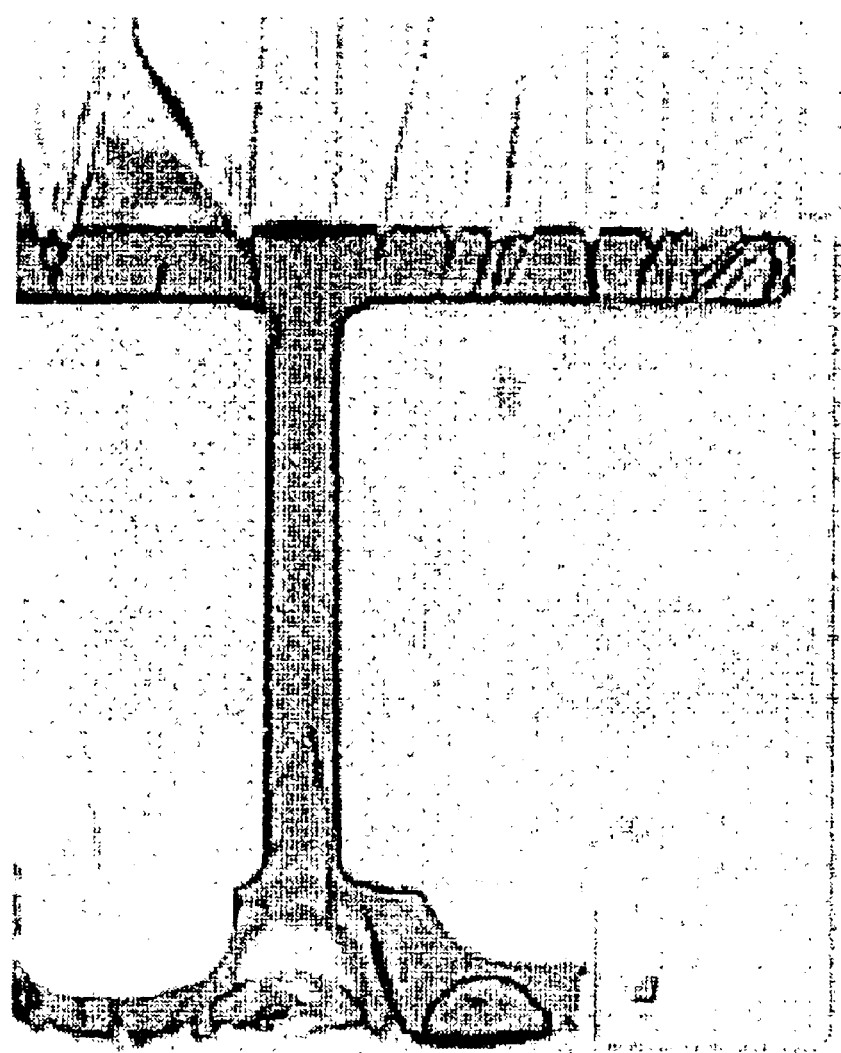
FIG. 10 is an optical microscope photograph showing a crystalline state of the completed operating semiconductor layer.

An optical microscope photograph of a crystalline state of the operating semiconductor layer 11 thus completed is shown in FIG. 10.

Here, seccoetching is executed to actualize the defect, and the crystallinity of a narrow region 11b is studied using a mask pattern which remains only the narrow region 11b. This is the reason why a portion of a wide region 11a is disappeared. It is recognized from the photograph that the narrow region 11b is in a single crystal state.

Figure 9:
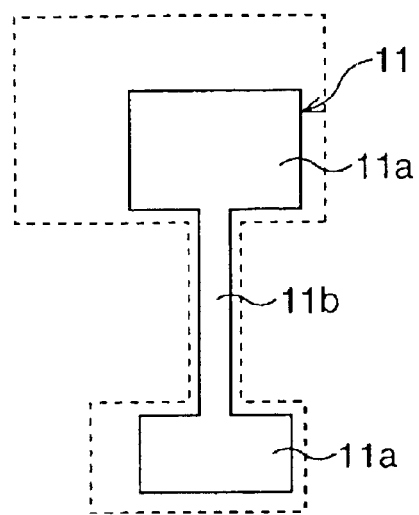
FIG. 9 is a diagrammatic plan view showing the patterned operating semiconductor layer.

By using thus formed silicon island, the TFT operating semiconductor layer 11 in a shape that the narrow region 11b is symmetric with respect to the wide region 11a may be formed by further new patterning as shown in FIG. 9. Here, since defects such as peeling off of the layer are easy to occur at a peripheral edge portion of the silicon island, a more excellent operating semiconductor layer having no defects is formed by removal of the peripheral portion with this patterning.

Modification Example

Considering an excellent crystal growth, a modification example for forming an operating semiconductor layer having a different patterning shape will be explained here.

Figure 11:
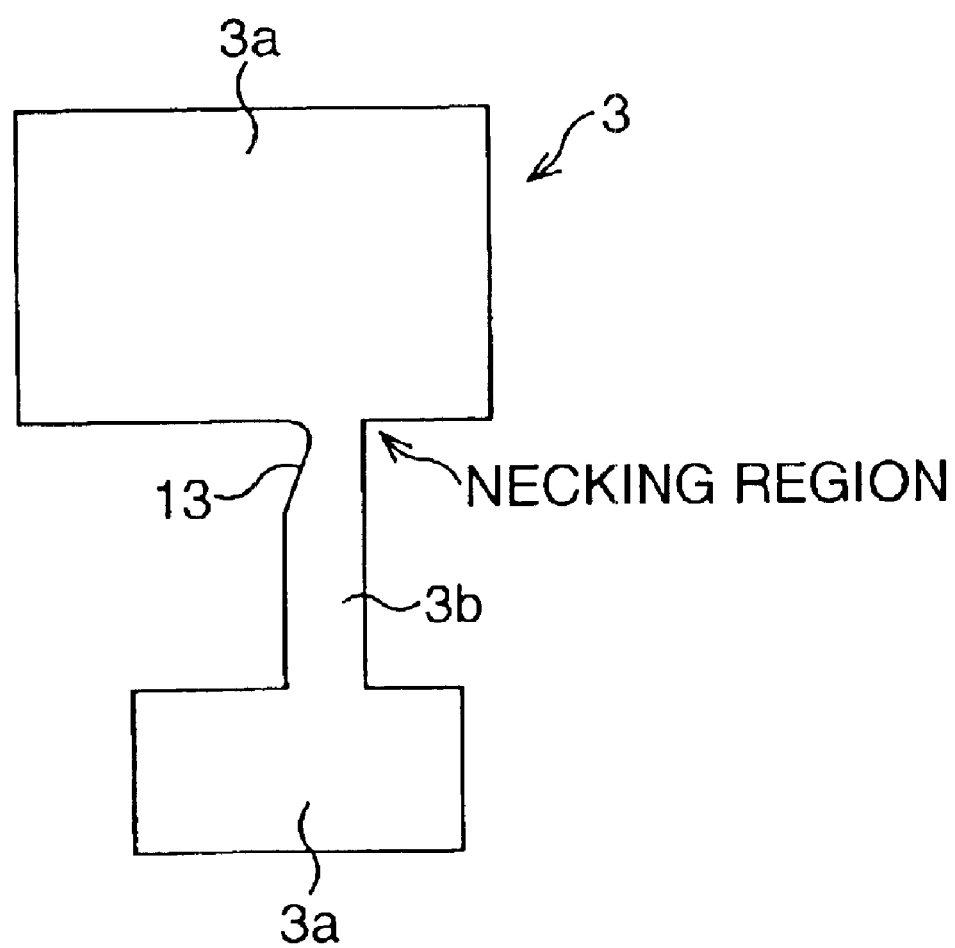
FIG. 11 is a diagrammatic plan view showing a state of the amorphous silicon layer of a modification example in the first forming method.

In this example, on processing the amorphous silicon layer 3 into an island shape, a cut-out 13 is formed at one end portion where a portion of the crystal grain boundary in the flow pattern of the wide region 3a comes near the narrow region 3b during the later laser beam irradiation process, as shown in FIG. 11. Then, the crystal grain boundary in the flow pattern is further restrained from entering into the narrow region 3b, so that single crystallization is realized with more reliability.

(Second Forming Method)

Next, a second forming method is explained. FIG. 12A, FIG. 12B, FIG. 12C, FIG. 12D and FIG. 13A, FIG. 13B, FIG. 13C, FIG. 13D are diagrammatic sectional views showing the second forming method of the operating semiconductor layer in its process order.

Figure 12A:
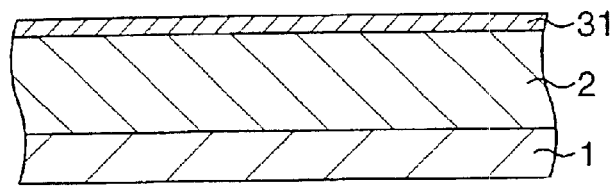
FIG. 12A, FIG. 12B, FIG. 12C and FIG. 12D are diagrammatic sectional views showing a method of forming an operating semiconductor layer in process order in a second forming method of an embodiment.

First, as shown in FIG. 12A, a silicon oxide layer 2 which is to be a buffer layer is formed on a glass substrate 1 in a layer thickness of about 400 nm. Then as a semiconductor layer with layer thickness of about 200 nm, here an amorphous silicon layer 31 made of amorphous silicon is formed by a PECVD method. The layer thickness of the amorphous silicon layer 31 is made to be 400 nm or less, preferably about 30 nm through about 200 nm, with respect to the relation with the layer thickness of the heat-retaining layer. Next, heat processing at 550° C. is applied on the glass substrate 1 for 2 hours to remove hydrogen.

Figure 12B:
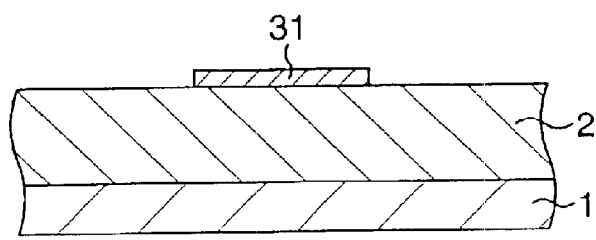
Figure 14:
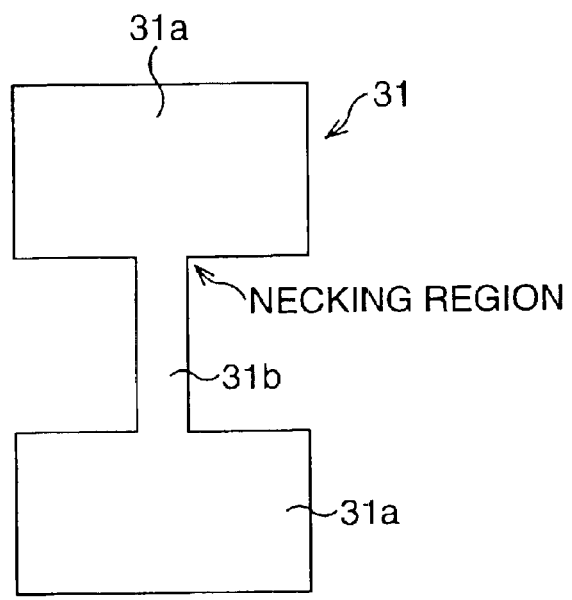
FIG. 14 is a diagrammatic plan view showing a processed amorphous silicon layer.

Next, as shown in FIG. 12B and FIG. 14, the amorphous silicon layer 31 is patterned by photolithography and dry etching to be shaped so that it has a wide region 31a and a narrow region 31b and the narrow region 31b is connected to the wide region 31a in a manner that the narrow region 31b is positioned to be symmetric with respect to the wide region 31a. Here, the vicinity of the boundary between the wide region 31a and the narrow region 31b becomes a necking region.

Figure 12C:
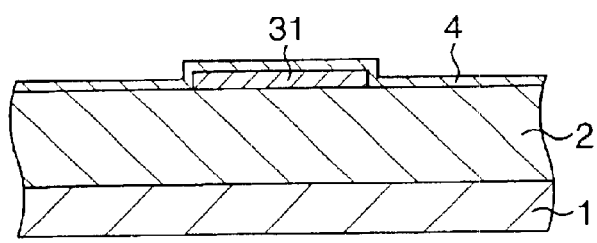

Then, as shown in FIG. 12C, a silicon oxide layer 4 which serves as a separation layer is formed by the PECVD method to have the layer thickness of about 50 nm and to cover the whole surface (side face and upper face) of the amorphous silicon layer 31.

Figure 12D:
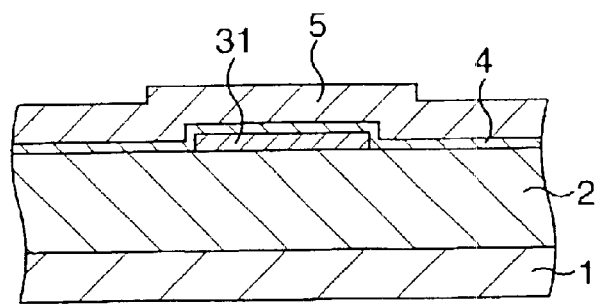

Next, as shown in FIG. 12D, an amorphous silicon layer is formed to have the layer thickness of about 250 nm by a plasma CVD method to cover the amorphous silicon layer 31 through the silicon oxide layer 4, and the amorphous silicon layer is changed into a polycrystalline silicon layer 5 by a metal induce solid-phase growth using nickel (Ni). For a metal impurity to induce the solid-phase growth, any metal other than Ni can be used. At this time, the solid-phase growth temperature is set to be 570° C. and time for the heat processing is set to be 8 hours. Though the amorphous silicon layer having the layer thickness of about 300 nm is changed into the polycrystalline silicon layer 5 through this processing, the amorphous silicon layer 31 covered with the silicon oxide film 4 which serves as the separation layer is kept in a state of amorphous silicon because the silicon oxide layer 4 prevents Ni from dispersion.

The polycrystalline silicon layer 5 may be formed so as to cover the amorphous silicon layer 31 by a chemical vapor growth method or a physical evaporation method from the beginning. It is also preferable to use amorphous silicon.

Figure 13A:
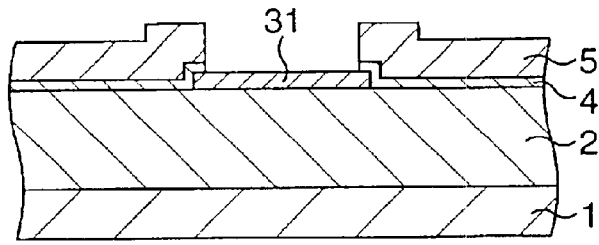
FIG. 13A, FIG. 13B, FIG. 13C and FIG. 13D are diagrammatic sectional views showing the method of forming the operating semiconductor layer in process order following to FIG. 12A, FIG. 12B, FIG. 12C and FIG. 12D.
Figure 15:
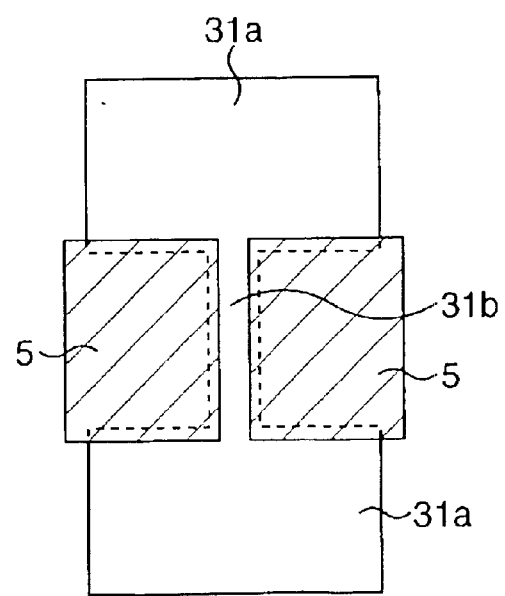
FIG. 15 is a diagrammatic plan view showing a state of the amorphous silicon layer on which a heat-retaining layer is formed.

Then, as shown in FIG. 13A and FIG. 15, the polycrystalline silicon layer 5 is patterned in an island shape to cover the side portion of the narrow region 31b, and then the exposed silicon oxide layer 4 is removed using HF solution. At this time, the surface of the narrow region 31b is exposed except the side portion.

Figure 13B:
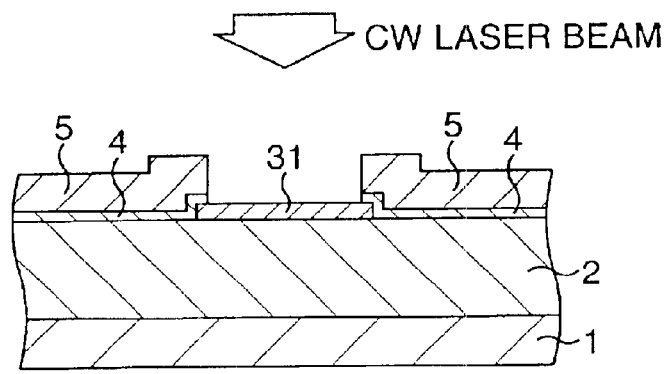

Then, as shown in FIG. 13B, the narrow region 31b is irradiated with a CW laser beam, here a solid-state laser (DPSS laser) of semiconductor excitation (LD excitation), from the top surface in a state that the polycrystalline silicon layer 5 as a heat-retaining layer encloses the narrow region 31b through the silicon oxide layer 4 from the side face to crystallize the amorphous silicone layer 31 so that the operating semiconductor layer 32 is formed.

As one example, the above-described solid-state laser, the CW laser here, is semiconductor LD excitation Nd: $YVO_4$ laser using second harmonic with wavelength of 532 nm, whose output is 10 W. In the solid-state laser of a semiconductor LD excitation, a noise (light noise) indicating instability of the energy beam is 0.1 rms % or less in a region of 10 Hz to 2 MHz, and an index of the energy beam output instability is less than ±1% per hour, which is extremely excellent compared to other energy beams.

Incidentally, a portion on which the CW laser beam irradiates is not limited to the front surface side of the substrate, but it may irradiate from the back surface side.

Figure 16:
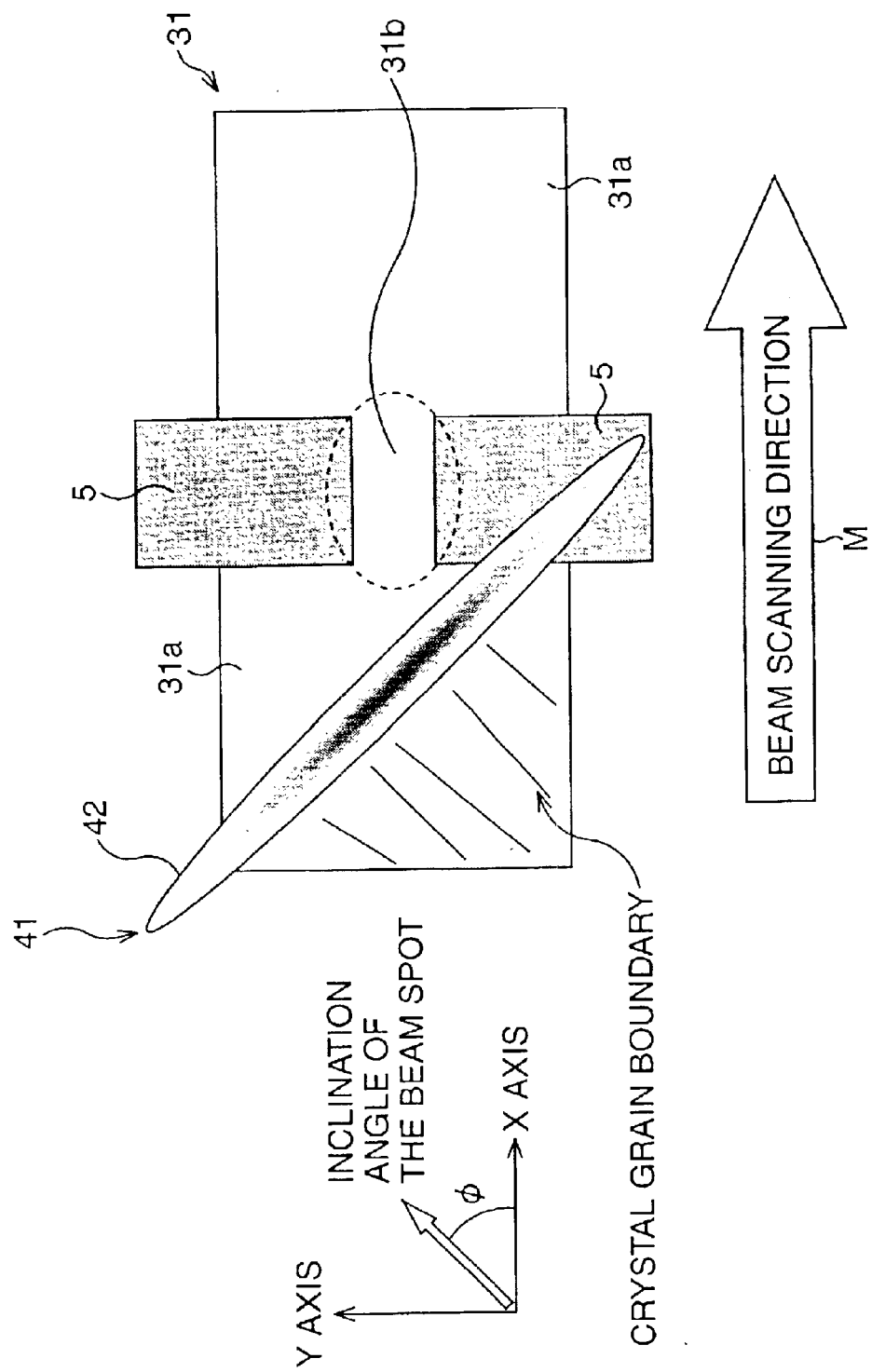
FIG. 16 is a diagrammatic plan view showing a direction of irradiation of a CW laser beam.

In this forming methods, when irradiating the CW laser beam onto the amorphous silicon layer 31, as shown in FIG. 16, a scanning plane 42 of a beam spot 41 of the CW laser beam is inclined by a predetermined angle (inclination angle ϕ) from a perpendicular position (indicated by Y axis in FIG. 16) to the longitudinal direction of the amorphous silicon layer 31 (indicated by X axis in the FIG. 16), and the beam spot 41 is scanned in the perpendicular direction to the longitudinal direction of the amorphous silicon layer 31 (indicated by Y axis and arrow M in FIG. 16). Here, for the beam spot 41, it is preferable to use one which is in a zonal shape or an elliptical shape and whose scanning plane 42 is substantially a flat plane. At this time, since a portion where the width becomes narrower abruptly serves as a necking region, a single crystal silicon is formed.

A mechanism to form a single crystal silicon by irradiation of the CW laser beam according to the forming methods is described as follows.

Figure 17:
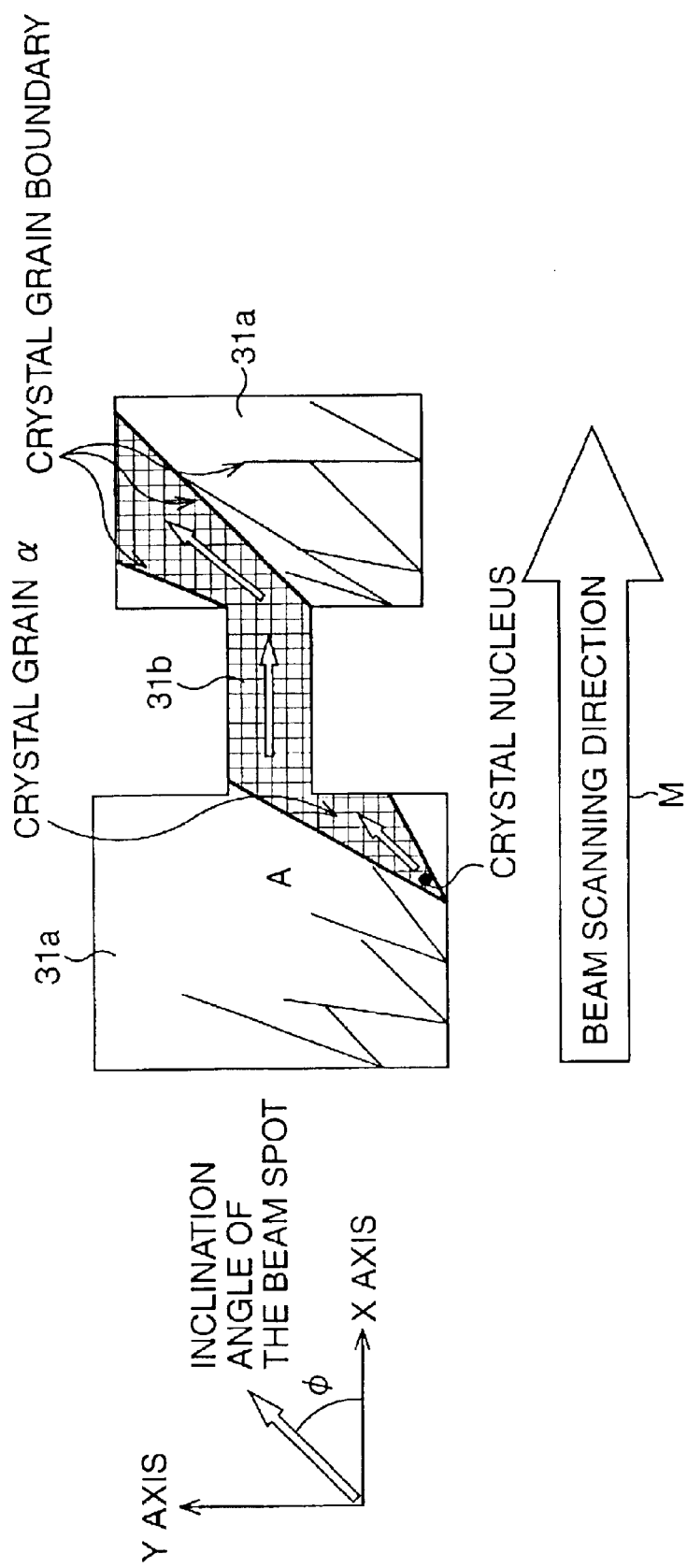
FIG. 17 is diagrammatic plan view showing a state of the crystal growth.

As shown in FIG. 17, in order to form the narrow region 31b to be a channel of the TFT into a single crystal, it is necessary to restrain the occurrence of the crystal nucleus on the narrow region 31b and to prevent the crystal grain boundary which is grown on a region A having a large area in the wide region 31a to become the boundary of the crystal grains from entering into the narrow region 31b. In this forming method, the beam spot 41 is scanned and irradiated by being inclined toward the boundary portion of the narrow region 31b to the wide region 31a, and the crystal grain boundary is formed in a perpendicular direction to a boundary of the scanning plane 42 of the beam spot 41. Therefore, the crystal grain boundary is formed obliquely to the extent to which the beam spot 41 is inclined to the X axis direction. Accordingly, even if the crystal grain boundary of one crystal grain which grows from a crystal nucleus enters into the narrow region 31b, the crystal grain boundary runs obliquely toward the narrow region 31b, and at the boundary portion of the narrow region 31b to the wide region 31a, the crystal grain boundaries collide against the wall of the narrow region 31b and most of them disappear, whereby the crystal grain boundaries are restrained from entering to the inside of the narrow region 31b. Therefore, the narrow region 31b is quite easy to get a single crystal state.

In this forming method, the crystal grain boundary enters obliquely with high reliability at the boundary portion between the wide region 31a and the narrow region 31b, which is different from the above-described first forming method. In other words, according to this forming method, the collision of the crystal grain boundary against the wall of the narrow region 31b is caused securely without depending on a kind of contingency.

Considering the above description, it is preferable to make the inclination angle ϕ of the scanning plane 42 of the beam spot 41 be +15° through +75°, or −75° through −15°. This is because when the angle is equal to or less than +15° (equal to or more than −15°), it is difficult for the crystal grain boundary to collide against the wall of the narrow region 31b, and when the angle is equal to or more than +75° (equal to or less than −75°), it is difficult to secure the effective irradiation of the CW laser beam to the amorphous silicon layer 31 since the rate of the single crystallization of the narrow region 31b is lowered.

Since the amorphous silicon layer 31 is covered with a thick polycrystalline silicon layer 5 which serves as a heat-retaining layer only at side portions of the narrow region 31b, the polycrystalline silicon layer 5 at the side surface serves as a heat reservoir having a large heat capacity. Therefore, cooling rate of the molten is made small and the heat distribution of the amorphous silicon layer 31 is controlled, whereby the position of nucleus formation and direction of crystal growth are controlled. In this case, crystallization proceeds by progress of the temperature lowering from the center portion of the narrow region 31b. However, since only the side portion of the narrow region 31b is selectively covered with the polycrystalline silicon layer 5, it is the most difficult to lower the temperature of this side portion and therefore effective crystallization can be realized. As a result, the crystalline state having a large crystal grain diameter can be realized with high reliability without occurrence of the crystal uncles from the sidewall of the narrow region 31b.

Additionally, since there is a tendency that the crystal grain grows larger as the scanning distance of the laser is longer, it is beneficial to grow the crystal in an oblique direction. Furthermore, similarly to the first forming method, by forming the narrow region 31b at an asymmetric position with respect to the wide region 31a and by forming the wide region 31a large, it is possible to further extend the scanning distance of the laser. Once a large crystal grain is formed, the possibility of the crystal grain boundary entering into the narrow region 31b is decreased more.

In the narrow region 31b, at the time of solidification after melting by the CW laser beam, temperature distribution of low temperature at the central portion and high temperature at the peripheral portion is formed. Owing to this temperature distribution, since the temperature gradient from the central portion toward the peripheral portion is formed, even if a crystal grain boundary is mixed into the narrow region 31b, it runs away toward the outside during growth of the crystal. In other words, when the scanning distance becomes longer, all defect portions run outside so that formation of the single crystal is promoted.

Due to the mechanism described above, the narrow region 31b is crystallized in a single crystal formation.

Figure 13C:
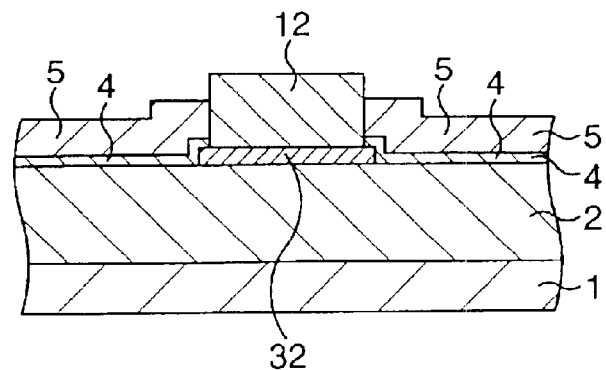

Thereafter, similarly to the first forming method, as shown in FIG. 13C, a portion where neither the silicon oxide layer 4 nor the polycrystalline silicon layer 5 exists in thus formed operating semiconductor layer 32 is covered with a resist film 12.

Figure 13D:
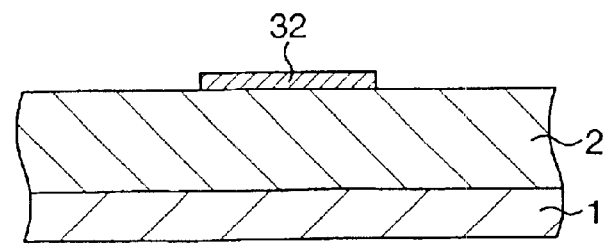

As shown in FIG. 13D, after the polycrystalline silicon layer 5 is removed by dry etching using the resist film 12 as a mask, the resist film 12 is removed by ashing treatment or the like, then the silicon oxide layer 4 is removed by HF solution.

As above, the operating semiconductor layer (silicon island) 32 is completed.

Figure 18:
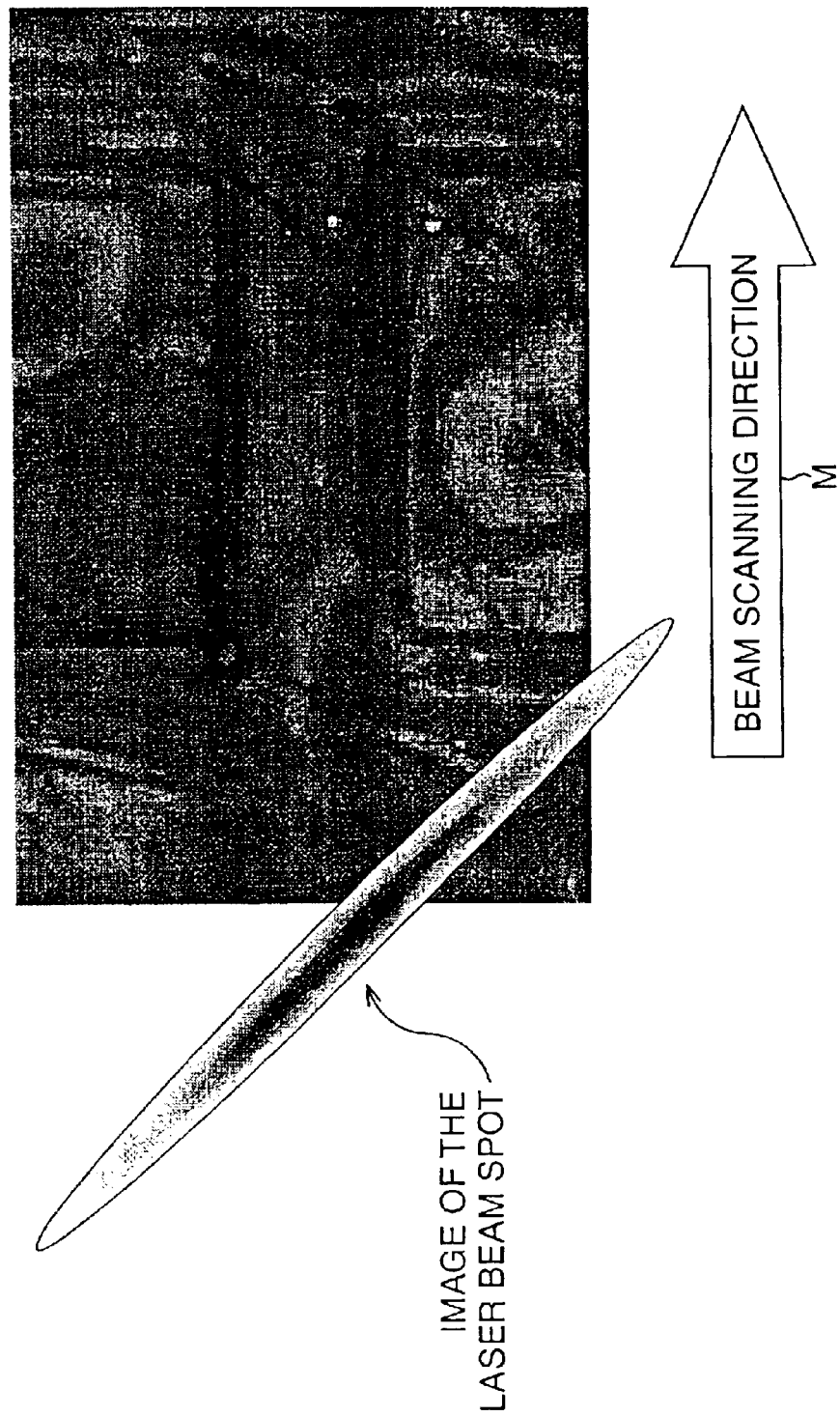
FIG. 18 is a photograph by an optical microscope showing a crystalline state of the completed operating semiconductor layer.

A photograph by an optical microscope of a crystalline state of the operating semiconductor layer 32 thus completed is shown in FIG. 18.

Here, as an example when crystallizing by giving the beam spot an inclination angle ϕ, one where the inclination angle ϕ is equal to 45° is exemplified. It is recognized that a single crystal grain is formed without a large crystal grain boundary in the narrow region. Additionally, since there is not recognized a great change in color of the interference colors of the layer in the narrow region, it is known that a flat layer can be obtained. As for the flatness of the operating semiconductor layer, it is considered to be sufficiently flat when roughness of the surface Ra is about 7 or less. Actually, when studying the roughness of the surface Ra in the narrow region by an observation image of AFM, Ra is equal to 4 nm.

Figure 19:
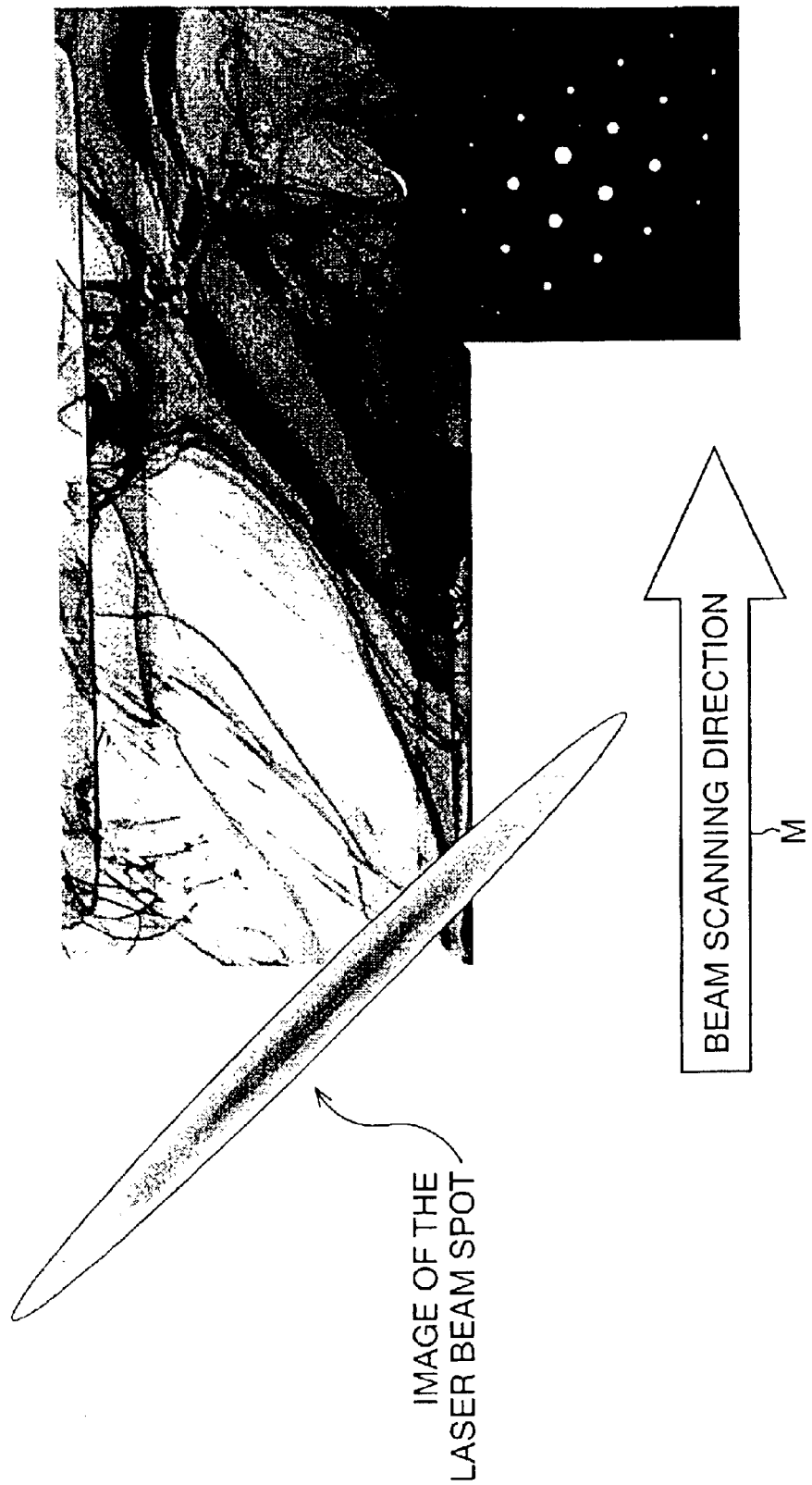
FIG. 19 is a TEM photograph showing the narrow region which is the same region as that of the optical microscope photograph (the inclination angle φ:45°) in FIG. 18.

Next, a result in an observation by TEM of the narrow region that is the same region as the optical microscope photograph in FIG. 18 (the inclination angle ϕ: 45°) is shown in FIG. 19.

Clear pattern without dislocation and the like is seen in an electron diffraction pattern and no crystal grain boundary is seen in the narrow region of about 8 $\mu$m×20 $\mu$m, so that a single crystal grain is recognized. Furthermore, it is recognized from the electron diffraction pattern that the single crystalline state in the narrow region has (110) orientation. Similarly, it is possible to be controlled to have (100) orientation as the single crystalline state. Actually, when the inventor studies the single crystalline state in the narrow region, it is recognized that it is easy for the crystal to have (100) orientation if the inclination angle $\phi$ is 150 to 45°, preferably 30° to 45°, and to have (110) orientation if the inclination angle $\phi$ is 45° to 75°, preferably 45° to 60°.

As above, according to the present forming method, it is possible to form a single crystal grain having excellent crystallinity and to control the orientation of the crystal when crystallizing the narrow region 31b of the amorphous silicon layer 31.

Figure 20:
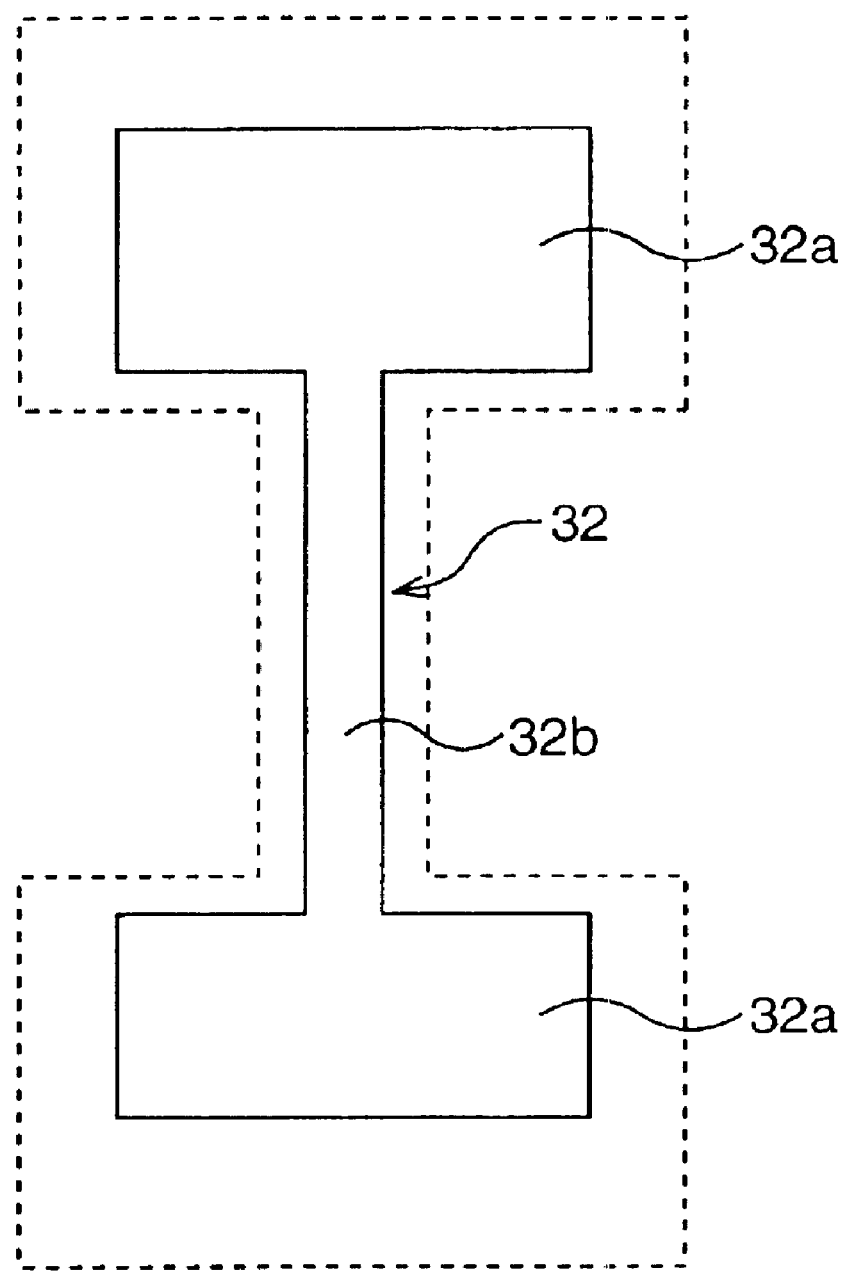
FIG. 20 is a diagrammatic sectional view showing a state of patterning to form a TFT operating semiconductor layer.

By using thus formed silicon island the TFT operating semiconductor layer 32 having a wide region 32a and a narrow region 32b may be formed by further new patterning as shown in FIG. 20. Here, since defects such as peeling off of the layer are easy to occur at a peripheral edge portion of the silicon island, the excellent operating semiconductor layer without defects is formed by removal of the peripheral edge portion by this patterning.

Modification Example

Figure 21:
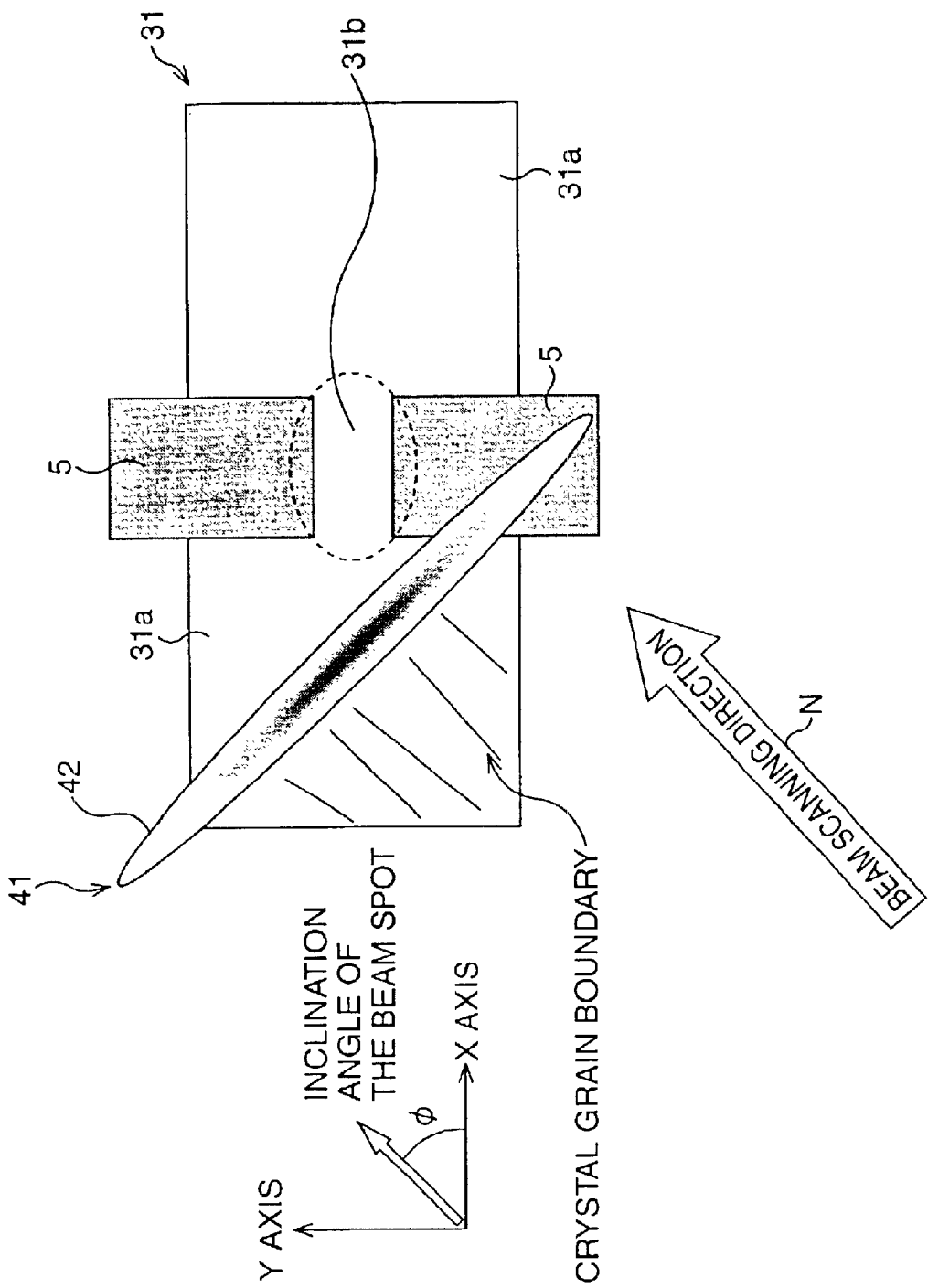
FIG. 21 is a diagrammatic plan view showing a state of a laser irradiation to the amorphous silicon layer in a modification example in the second forming method.
Figure 22A:
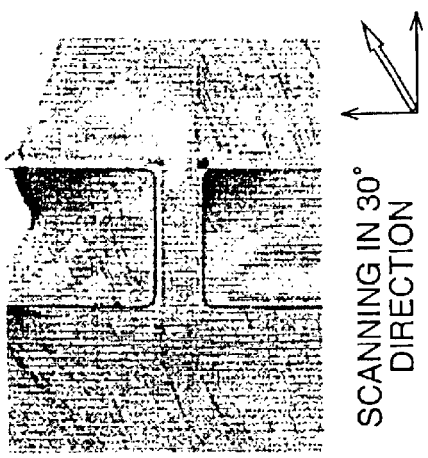
FIG. 22A, FIG. 22B, FIG. 22C, and FIG. 22D are photographs by the optical microscope showing crystalline states of the completed operating semiconductor layer.
Figure 22B:
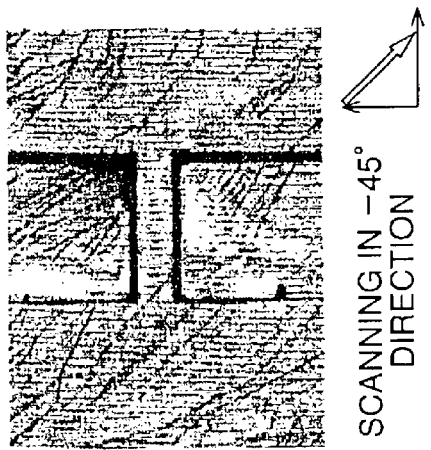
Figure 22C:
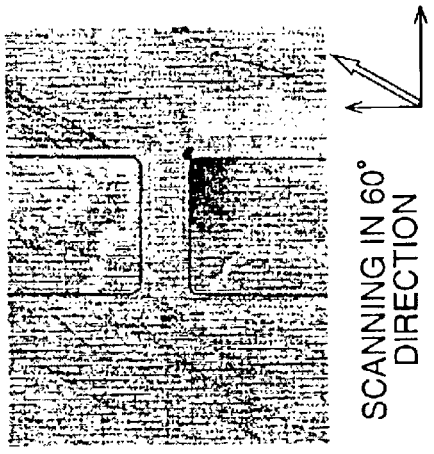
Figure 22D:
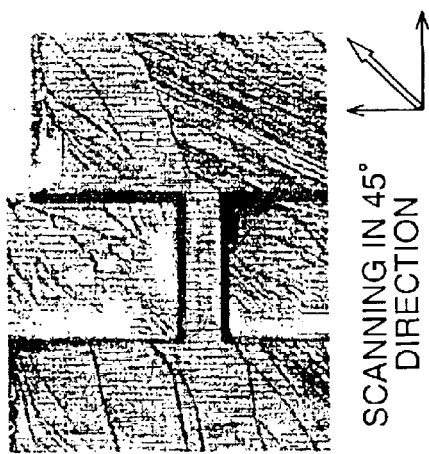

In the aforementioned second forming method, on irradiating the CW laser beam to the amorphous silicon layer 31, it is disclosed that the beam spot 41 is scanned in the perpendicular direction to the longitudinal direction of the amorphous silicon layer 31 by inclining the scanning plane 42 of the beam spot 41 by the inclination angle $\phi$. In this modification example, however, as shown in FIG. 21, the scanning plane 42 of the beam spot 41 is inclined by the inclination angle $\phi$ and the beam spot 41 is scanned along a direction of the inclination angle $\phi$ (indicated by arrow N in FIG. 21). Incidentally, in this modification example, only the scanning direction of the beam spot 41 is different from that of the second forming method, but the shape of the operating semiconductor layer 32, the aspect and mechanism of crystallization, the structure and usage (except the scanning direction) of the CW laser, and the like are the same as those of the second forming method.

A photograph by an optical microscope of a crystalline state of the completed operating semiconductor layer 32 is shown in FIG. 22.

Here, as respective examples when crystallizing by giving the beam spot an inclination angle $\phi$, those with the inclination angle $\phi$ and the scanning direction of −45°, 30°, 45°, and 60° are exemplified respectively in FIG. 22A, FIG. 22B, FIG. 22C, and FIG. 22D. In the respective photographs, it is recognized that a single crystal grain is formed without a large crystal grain boundary in the narrow region. Additionally, since a great change in color of the interference colors of the layer is not seen in the narrow region, it is recognized that a flat layer can be obtained.

Next, a result in a mapping analysis is shown in FIG. 23A, FIG. 23B and FIG. 23C where the same narrow regions as the photographs by the optical microscope in FIG. 22A, FIG. 22B, FIG. 22C, and FIG. 22D (the inclination angle $\phi$ and the scanning direction of 30°, 45°, and 60°) are observed by an EBSD (Electron Back Scattered Diffraction) system. FIG. 23A, FIG. 23B and FIG. 23C correspond to the inclination angle $\phi$ and the scanning direction of 30°, 45° and 60° respectively. In each of FIG. 23A, FIG. 23B and FIG. 23C, which direction the orientation of the crystal grain surface points to with respect to (100) is indicated by color of the basic triangle.

Since there is no great change in color and it is indicated by the same color in the whole narrow region in an IPF (Inverse Pole Figure) mapping analysis which shows an indicator of the crystal orientation, it is recognized that a single crystal grain is formed. Furthermore, since the crystal grain in the narrow region can be clearly seen in an IQ (Image Quality) mapping analysis which shows an indicator of clearness in the EBSD system, it is recognized that the crystal grain having a quite excellent crystallinity where neither a crystal grain boundary nor a surface strain exists is formed in the narrow region.

Additionally, when any portions of the narrow region formed by the laser scanning at the same inclination angle $\phi$ and the same scanning direction are respectively selected and analyzed by the EBSD, the orientations of the respective crystals are relatively close to (100) at the same inclination angle $\phi$ and the scanning direction. This indicates that it is possible to control the orientation of the crystal in certain extent by adjusting the inclination angle $\phi$ and the scanning direction. Concretely, when the inventor studies the single crystalline state in the narrow region, it is recognized that it is easy for the crystal to have (100) orientation if the inclination angle $\phi$ is 15° to 45°, preferably 30° to 45°, and to have (110) orientation if the inclination angle $\phi$ is 45° to 75°, preferably 45° to 60°.

In this modification, similarly to the second forming method, collision of the crystal grain boundary against the wall of the narrow region 31b can be caused securely without depending on a kind of contingency, whereby it is possible to make the narrow region 31b become a single crystalline state of a large grain diameter with high reliability.

Production of TFT

Using an operating semiconductor layer 11 or 32 formed as above, a TFT (n-channel TFT) is produced. FIG. 24A to FIG. 27C are diagrammatic sectional views showing a production method of the TFT relating to the present embodiment in the process order. Description is made below assuming that the operating semiconductor layer 11 is used according to the first forming method.

Figure 24A:
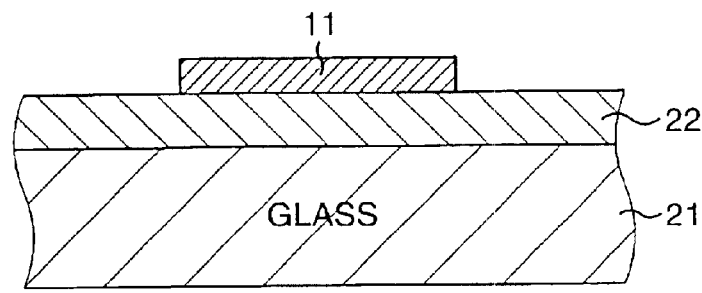
FIG. 24A, FIG. 24B and FIG. 24C are diagrammatic sectional views showing a method of producing a TFT relating to the present embodiment in process order.

First, as shown in FIG. 24A, the operating semiconductor layer 11 which is formed by the above method is prepared above a glass substrate 21 through a silicon oxide layer 22 which serves as a buffer. Here, a narrow region 11b of the operating semiconductor layer 11 serves as a channel.

Figure 24B:
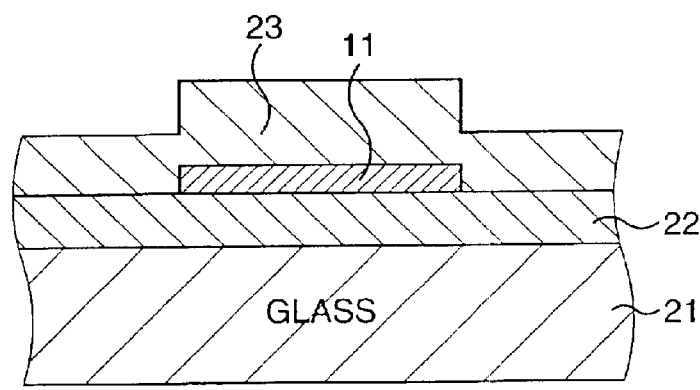

Then, as shown in FIG. 24B, a silicon oxide layer 23 which is to be a gate oxide film having the layer thickness of about 120 nm is formed on the operating semiconductor layer 11 by a PECVD method. At this time, other methods, for instance, an LPCVD method or a sputtering method may be used.

Figure 24C:
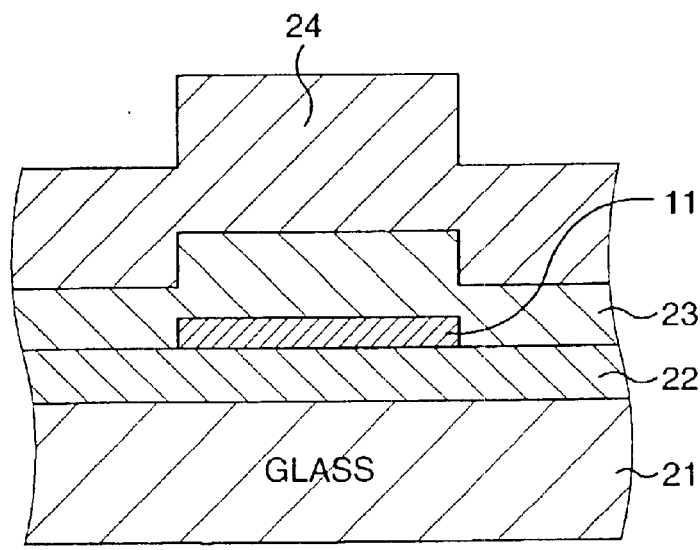

Then, as shown in FIG. 24C, an aluminum film (or an aluminum alloy film) 24 is formed to have the film thickness of about 350 nm by a sputtering method.

Figure 25A:
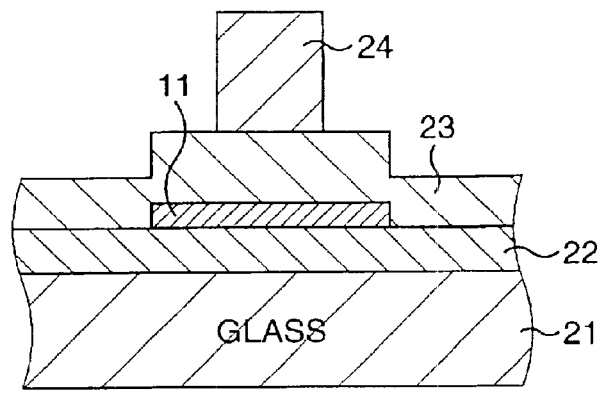
FIG. 25A, FIG. 25B and FIG. 25C are diagrammatic sectional views showing the method of producing the TFT relating to the present embodiment following to FIG. 24A, FIG. 24B and FIG. 24C in process order.

Next, as shown in FIG. 25A, the aluminum film 24 is patterned into a shape of an electrode by photolithography and following dry etching to form a gate electrode 24.

Figure 25B:
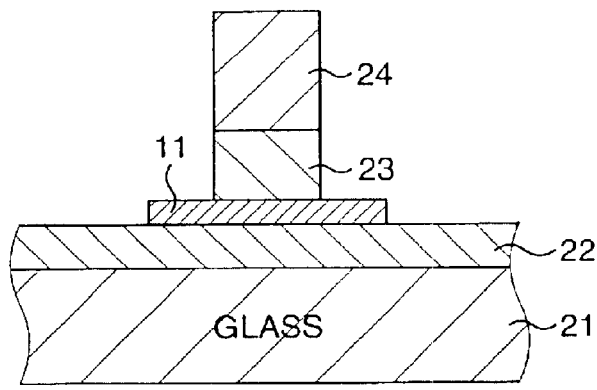

Then, as shown in FIG. 25B, the silicon oxide layer 23 is patterned using the patterned gate electrode 24 as a mask to form the gate oxide film 23 copying the shape of the gate electrode 24.

Figure 25C:
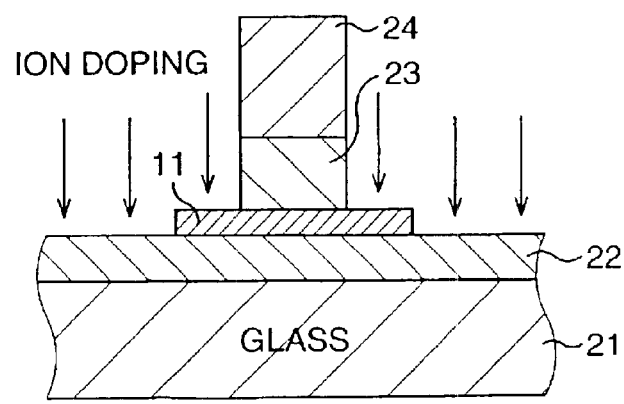

Then, as shown in FIG. 25C, the gate electrode 24 of the operating semiconductor layer 11 is ion doped on its both side portions using the gate electrode 24 as a mask. Concretely, an n-type impurity, phosphorus (P) here, is ion doped under the condition of acceleration energy 10 keV and dose amount $5 \times 10^{15}/cm^2$, to form a source/drain region.

Figure 26A:
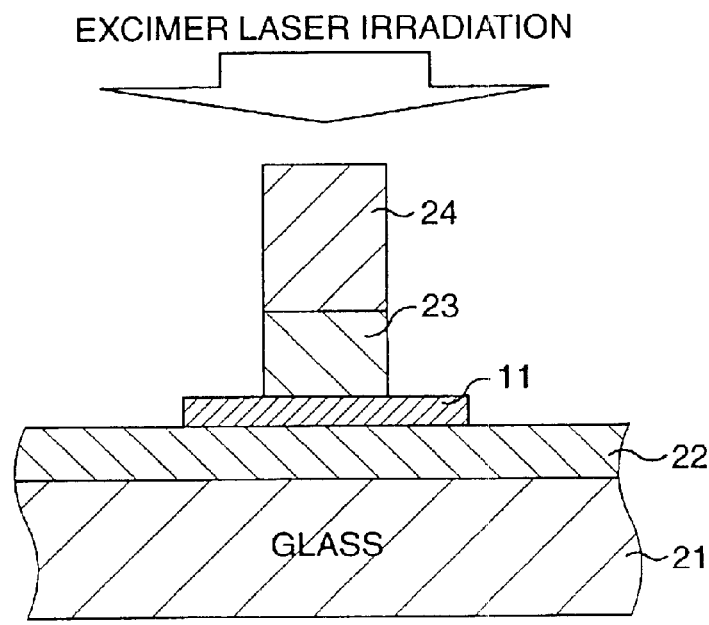
FIG. 26A and FIG. 26B are diagrammatic sectional views showing the method of producing the TFT relating to the present embodiment following to FIG. 25A, FIG. 25B and FIG. 25C in process order.
Figure 26B:
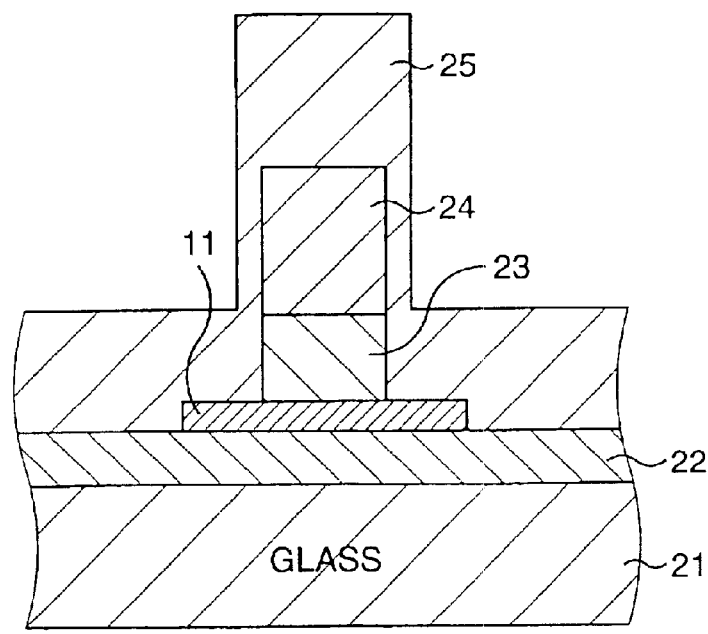

Then, as shown in FIG. 26A, after the excimer laser irradiation is applied on the source/drain region to activate the phosphorus therein, as shown in FIG. 26B, SiN is deposited with the layer thickness of about 300 nm to cover the whole surfaces so as to form an interlayer insulation layer 25.

Figure 27A:
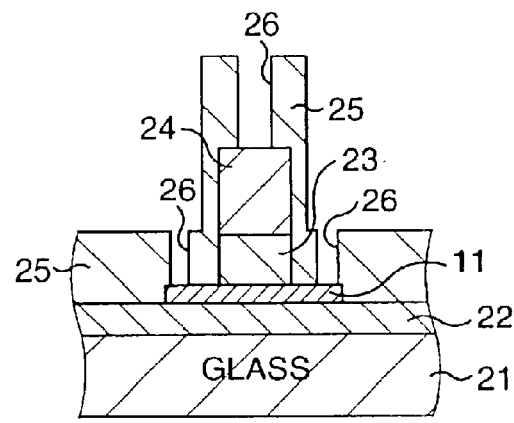
FIG. 27A, FIG. 27B and FIG. 27C are diagrammatic sectional views showing the method of producing the TFT relating to the present embodiment following FIG. 26A and FIG. 26B in process order.

Then, as shown in FIG. 27A, each contact hole 26 which allows a surface portion of the gate electrode 24 and a surface portion of the source/drain region of the operating semiconductor layer 11 to expose respectively is formed as an aperture on the interlayer insulation layer 25.

Figure 27B:
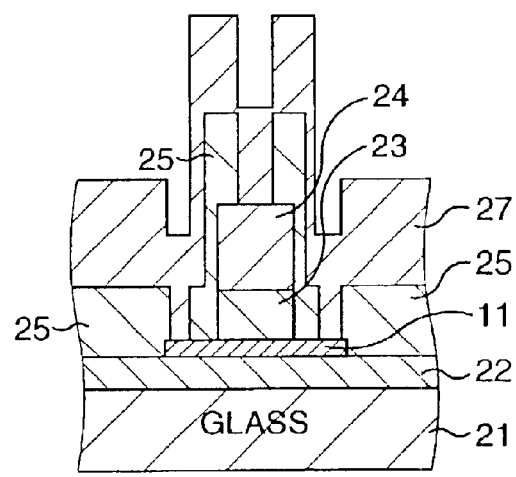
Figure 27C:
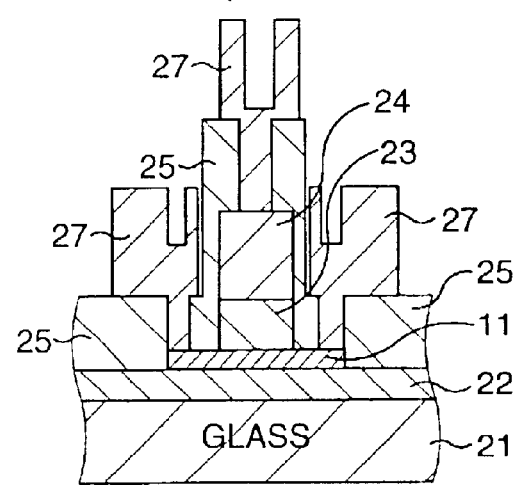

Then, as shown in FIG. 27B, after a metal film 27 made of aluminum or the like is formed so as to embed each contact hole 26, the metal film 27 is patterned to form a wiring 27 which conducts to the gate electrode 24 and the source/drain region of the operating semiconductor layer 11 through the contact holes 26 respectively as shown in FIG. 27C.

After that, the n-type TFT is completed after formation and the like of a heat-retaining layer covering the whole surface.

Figure 28A:
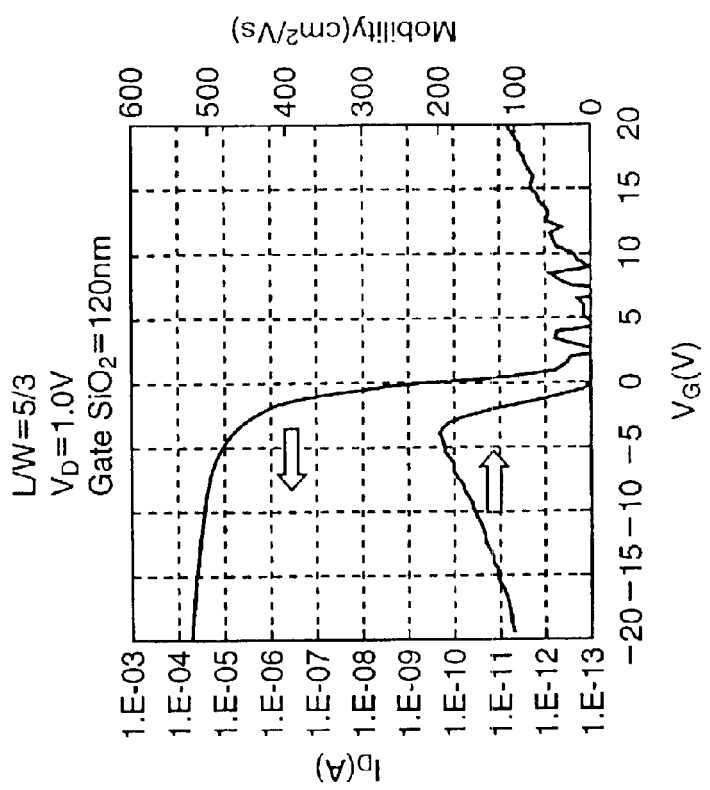
FIG. 28A and FIG. 28B are characteristic view respectively showing the mobility of an n-type and a p-type TFT using the operating semiconductor layer according to the first forming method.
Figure 28B:
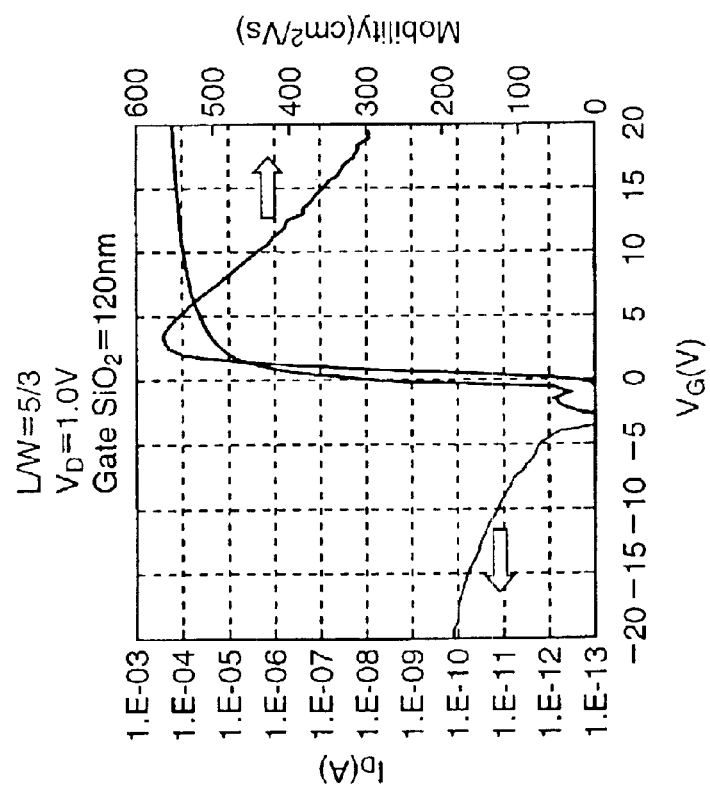

Actually, the n-type TFT of this embodiment is produced in such a manner that the operating semiconductor layer 11 is in the channel length of about 5 μm and in the channel width of about 3 μm. As a result of measuring the mobility thereof, the high mobility so much as 560 $cm^2/Vs$ can be attained (FIG. 28A). Incidentally, as a result of measuring the mobility of a p-type TFT which is produced using the same method, the mobility of 200 $cm^2/Vs$ can be realized (FIG. 28B).

Figure 29A:
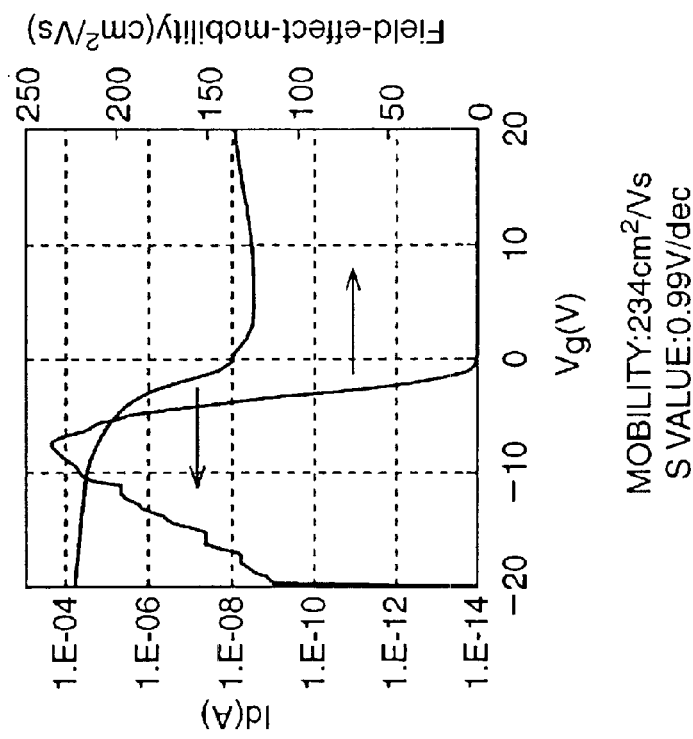
FIG. 29A and FIG. 29B are characteristic view respectively showing the mobility of an n-type and a p-type TFT using the operating semiconductor layer according to the second forming method.
Figure 29B:
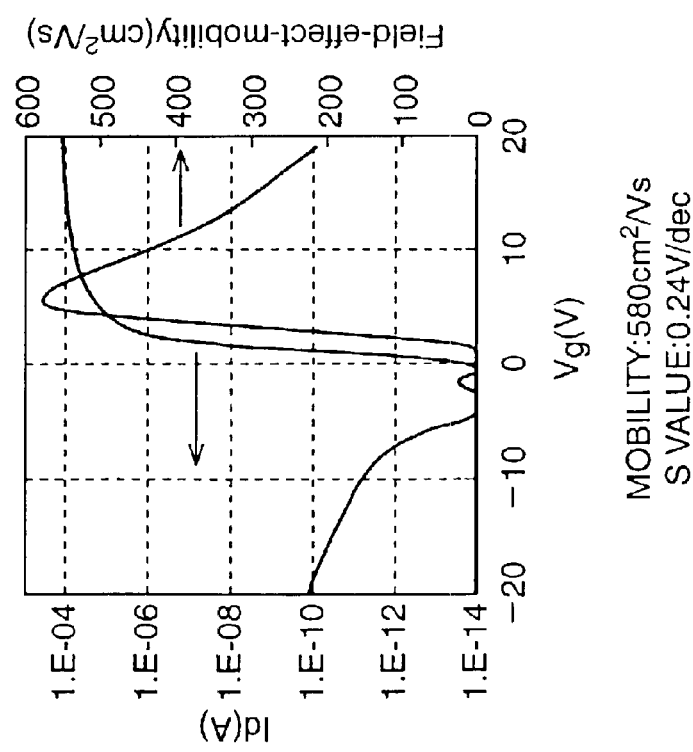

Additionally, using the operating semiconductor layer 32 according to the second forming method, the n-type TFT (the channel length of about 5 μm, the channel width of about 3 μm) is produced in the same manner as FIG. 24A to FIG. 27C. As a result of measuring the mobility thereof, the high mobility so much as 580 $cm^2/Vs$ can be realized (FIG. 29A). Incidentally, as a result of measuring the mobility of a p-type TFT which is produced using the same method, the mobility of 234 $cm^2/Vs$ can be realized (FIG. 29B).

As described above, according to the present embodiment, an excellent operating semiconductor layer 11 or 32 having a negligibly small effect of the crystal grain boundary can be formed to realize a TFT with extremely high mobility.

It should be noted that though amorphous silicon is used as a semiconductor layer in the present embodiment, polycrystalline silicon other than the amorphous silicon can be used. In addition, this polycrystalline silicon can be formed by a metal induce solid-phase growth. It is also preferable to improve quality of crystal by raising temperature of the substrate or to relax the heat strain on crystallizing. Furthermore, a mixture (compound) of silicon and germanium can be used.

The semiconductor device explained in the present embodiment can be applied to a liquid crystal display (LCD) of a peripheral circuit integrated type provided with TFT, a system-on-panel, a system-on-glass and further an SOI element.

According to the present invention, it is possible to provide a thin-film type semiconductor device which realizes extremely high mobility by forming an operating semiconductor layer from a thin semiconductor layer having a negligibly small effect of the crystal grain boundary, and to provide a method of production of the semiconductor device enabling to produce the semiconductor device easily and securely.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A method of production of a thin flu type semiconductor device provided with a substrate and an operating semiconductor layer pattern-formed above the substrate, comprising:

forming a semiconductor layer to be the operating semiconductor layer above the substrate;

processing the semiconductor layer to be shaped so that it has a wide region and a narrow region and that the narrow region is connected to the wide region in a manner that the narrow region is positioned to be asymmetric with respect to the wide region;

forming a heat-retaining layer on the narrow region to cover a side portion of the narrow region selectively through a separation layer after processing the semi conductor layer; and crystallizing the semiconductor layer by irradiating an energy beam onto the semiconductor layer along a longitudinal direction of the narrow region from the wide region toward the narrow region in a state that the heat-retaining layer is formed.

2. The method of production of the semiconductor device according to claim 1, wherein a cut-out is formed in the narrow region on processing the semiconductor layer.

3. The method of production of the semiconductor device according to claim 1, wherein after crystallization of the semiconductor layer, the operating semiconductor layer is patterned by removing a peripheral edge portion of the semiconductor layer in order to make the semiconductor layer be shaped so that the narrow region is positioned to be symmetric with respect to the wide region.

4. The method of production of the semiconductor device according to claim 1, wherein the energy beam outputs energy continuously with respect to time.

5. The method of production of the semiconductor device according to claim 4, wherein the energy beam outputting energy continuously with respect to time is a CW laser beam.

6. The method of production of the semiconductor device according to claim 5, wherein the CW laser beam is a solid-state laser beam of semiconductor excitation.

7. The method of production of the semiconductor device according to claim 4, wherein the output instability of the energy beam is less than ±1% per hour.

8. The method of production of the semiconductor device according to claim 1, wherein the semiconductor layer is formed to have the thickness of 400 nm or less.

9. The method of production of the semiconductor device according to claim 1, wherein the narrow region is formed to be a channel for the operating semiconductor layer.

10. The method of production of the semiconductor de ice according to claim 1, wherein the narrow region is formed to have the width thereof narrower than the width of the crystal grain.

11. The method of production of the semiconductor de ice according to claim 1, wherein a beam spot of the energy beam is in a zonal shape or an elliptic shape and a scanning plane thereof is substantially a flat plane.

12. The method of production of the semiconductor device according to claim 1, wherein the CW laser beam outputting energy continuously is irradiated with its pulse modulated by matching to the narrow region (the position to be a channel).

13. A method of production of a thin-film type semiconductor device provided with a substrate and an operating semiconductor layer pattern-formed above the substrate, comprising:

forming a semiconductor layer to be the operating semiconductor layer above the substrate;

processing the semiconductor layer to be shaped so that it has a wide region and a narrow region; and crystallizing the semiconductor layer by irradiating an energy beam onto the semiconductor layer in such a manner that a scanning plane of a beam spot of the energy beam is inclined from a perpendicular position to a longitudinal direction of the semiconductor layer.

14. The method of production of the semiconductor device according to claim 13, wherein the beam spot is scanned along the longitudinal direction of the semiconductor layer when irradiating the energy beam to the semiconductor layer.

15. The method of production of the semiconductor device according to claim 13, wherein the beam spot is scanned in a perpendicular direction to the scanning plane of the inclined beam spot when irradiating the energy beam to the semiconductor layer.

16. The method of production of the semiconductor device according to claim 13, wherein the inclination angle of the scanning plane of the beam spot is between +15° and +75°, or between −75° and −15°.

17. The method of production of the semiconductor de ice according to claim 13, wherein a cut-out is formed in the narrow region when processing the semiconductor layer.

18. The method of production of the semiconductor device according to claim 14, further comprising:

forming a heat-retaining layer on the narrow region to cover a side portion of the narrow region through a separation layer after processing the semiconductor layer, wherein the energy beam is irradiated onto the semiconductor layer along the longitudinal direction of the narrow region in a state that the heat-retaining layer is formed.

19. The method of production of the semiconductor device according to claim 17, wherein after crystallization of the semiconductor layer, the operating semiconductor layer is patterned by removing a peripheral edge portion of the semiconductor layer in order to make the semiconductor layer be shaped so that the narrow region is positioned to be symmetric with respect to the wide region.

20. The method of production of the semiconductor device according to claim 13, wherein the energy beam outputs energy continuously with respect to time.

21. The method of production of the semiconductor device according to claim 20, wherein the energy beam outputting energy continuously with respect to time is a CW laser beam.

22. The method of production of the semiconductor device according to claim 21, wherein the CW laser beam is a solid-state laser beam of semiconductor excitation.

23. The method of production of the semiconductor device according to claim 20, wherein the output instability of the energy beam is less than ±1% per hour.

24. The method of production of the semiconductor de ice according to claim 13, wherein the semiconductor layer is formed to have the thickness of 400 nm or less.

25. The method of production of the semiconductor de ice according to claim 13, wherein the narrow region is formed to be a channel for the operating semiconductor layer.

26. The method of production of the semiconductor device according to claim 13, wherein the narrow region is formed to have the width thereof narrower than the width of the crystal grain.

27. The method of production of the semiconductor device according to claim 13, wherein the beam spot of the energy beam is in a zonal shape or an elliptic shape and the scanning plane thereof is substantially a flat plane.

28. The method of production of the semiconductor device according to claim 13, wherein the CW laser beam outputting energy continuously is irradiated with its pulse modulated by matching to the narrow region (the position to be a channel).

* * * * *

UNITED STATES PATENT AND TRADEMARK OFFICE
CERTIFICATE OF CORRECTION

PATENT NO. : 6,767,773 B2
DATED : July 27, 2004
INVENTOR(S) : Yasuyuki Sano et al.

It is certified that error appears in the above-identified patent and that said Letters Patent is hereby corrected as shown below:

Column 16,
Line 64, change "de ice" to -- device --.

Column 17,
Lines 1 and 37, change "de ice" to -- device --.

Column 18,
Lines 25 and 28, change "de ice" to -- device --.

Signed and Sealed this

Fourteenth Day of December, 2004

JON W. DUDAS
*Director of the United States Patent and Trademark Office*